(12) United States Patent
Yamada

(10) Patent No.: US 7,873,426 B2
(45) Date of Patent: Jan. 18, 2011

(54) DIGITAL RECORDING DEVICE, DIGITAL RECORDING METHOD, PROGRAM, AND STORAGE MEDIUM

(75) Inventor: Eiichi Yamada, Tokyo (JP)

(73) Assignee: Sony Corporation, Tokyo (JP)

( * ) Notice: Subject to any disclaimer, the term of this patent is extended or adjusted under 35 U.S.C. 154(b) by 1118 days.

(21) Appl. No.: 11/553,732

(22) Filed: Oct. 27, 2006

(65) Prior Publication Data

US 2007/0103355 A1    May 10, 2007

(30) Foreign Application Priority Data

Nov. 8, 2005    (JP)    ............................. 2005-324019

(51) Int. Cl.
    *G06F 17/00*    (2006.01)
(52) U.S. Cl. ....................................... 700/94
(58) Field of Classification Search ............... 700/94
    See application file for complete search history.

(56) References Cited

U.S. PATENT DOCUMENTS

| | | | |
|---|---|---|---|
| 5,777,569 A * | 7/1998 | Naruki et al. ................ 341/155 |
| 6,031,478 A * | 2/2000 | Oberhammer et al. ...... 341/155 |
| 6,317,065 B1 * | 11/2001 | Raleigh et al. ............... 341/139 |
| 6,377,196 B1 * | 4/2002 | Kolsrud et al. .............. 341/118 |
| 7,176,819 B1 * | 2/2007 | Swerlein et al. ............. 341/143 |
| 7,656,327 B2 * | 2/2010 | Filipovic et al. ............ 341/139 |
| 2003/0020558 A1 * | 1/2003 | Tiihonen et al. ............ 333/17.1 |
| 2004/0047432 A1 * | 3/2004 | Iwasaki ....................... 375/297 |
| 2004/0242172 A1 * | 12/2004 | Haim et al. ............... 455/127.2 |
| 2005/0075743 A1 * | 4/2005 | Kondo et al. .................. 700/94 |
| 2005/0091311 A1 * | 4/2005 | Lund et al. ................... 709/203 |
| 2005/0275576 A1 * | 12/2005 | Fudge et al. ................. 341/155 |
| 2007/0003078 A1 * | 1/2007 | Escott et al. ................. 381/107 |

FOREIGN PATENT DOCUMENTS

JP    8-55428    2/1996

\* cited by examiner

*Primary Examiner*—Curtis Kuntz
*Assistant Examiner*—Paul McCord
(74) *Attorney, Agent, or Firm*—Oblon, Spivak, McClelland, Maier & Neustadt, L.L.P.

(57) ABSTRACT

A digital recording device includes a microphone configured to convert collected sound into an analog audio signal; a first analog to digital converter configured to convert the signal converted by the microphone into a digital audio signal; a first memory configured to store the digital audio signal of the first analog to digital converter; an attenuator configured to attenuate the analog audio signal with a predetermined attenuation factor; a second analog to digital converter configured to convert the attenuated signal into a digital audio signal; a second memory configured to store the digital audio signal of the second analog to digital converter; an audio signal generating unit configured to extract the digital audio signal in one of the first memory and the second memory for a required time range according to an amplitude maximum value of the signal, and generate a new digital audio signal; and an audio signal memory for storing the generated digital audio signal.

17 Claims, 19 Drawing Sheets

FIG. 8
(FIRST MEMORY)
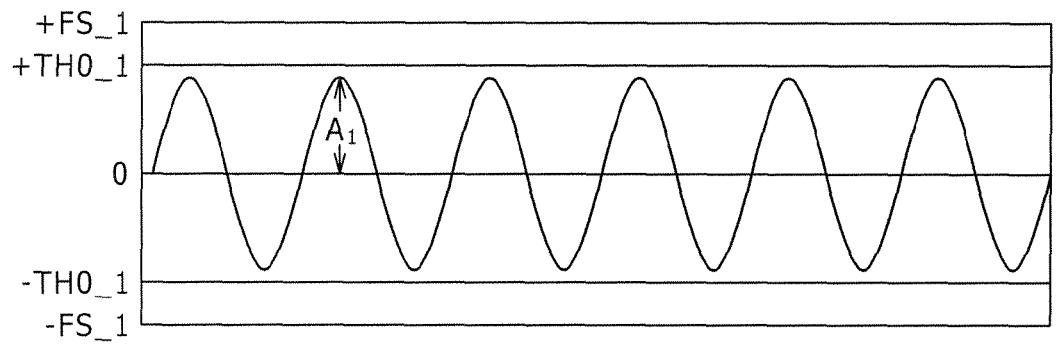
(SECOND MEMORY)
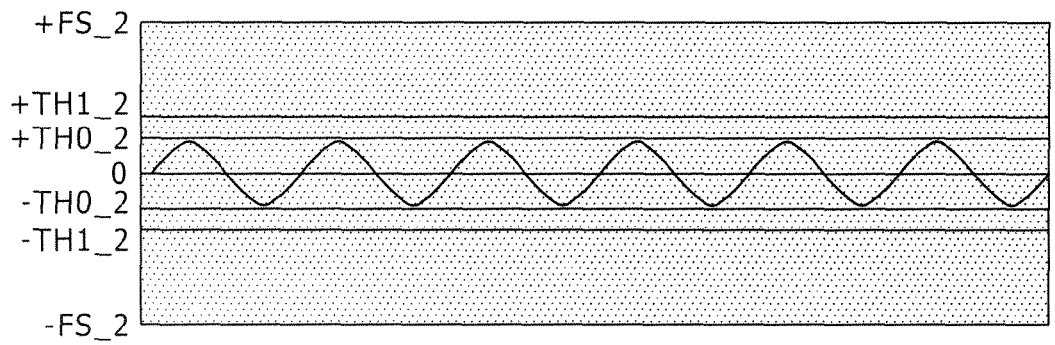
(AUDIO SIGNAL MEMORY)
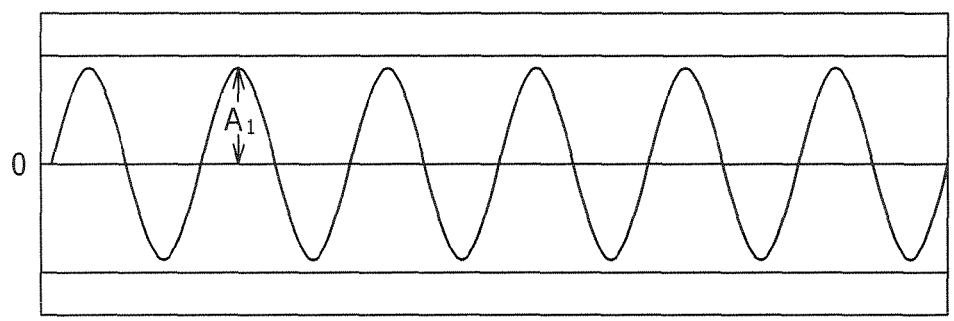

FIG.9
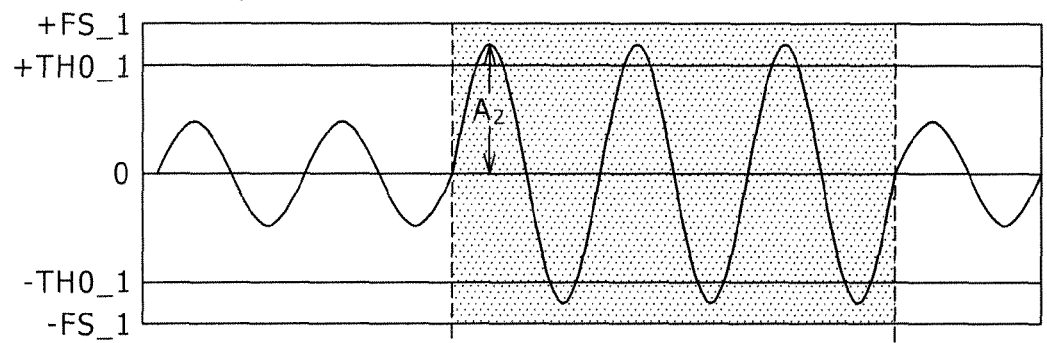
(FIRST MEMORY)
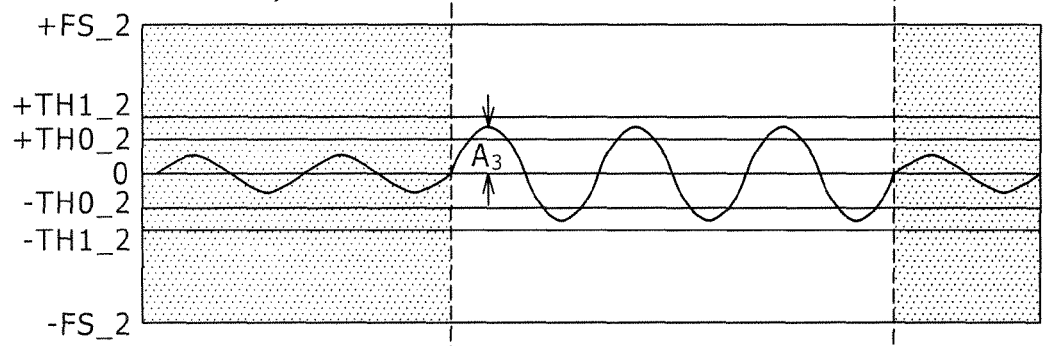
(SECOND MEMORY)
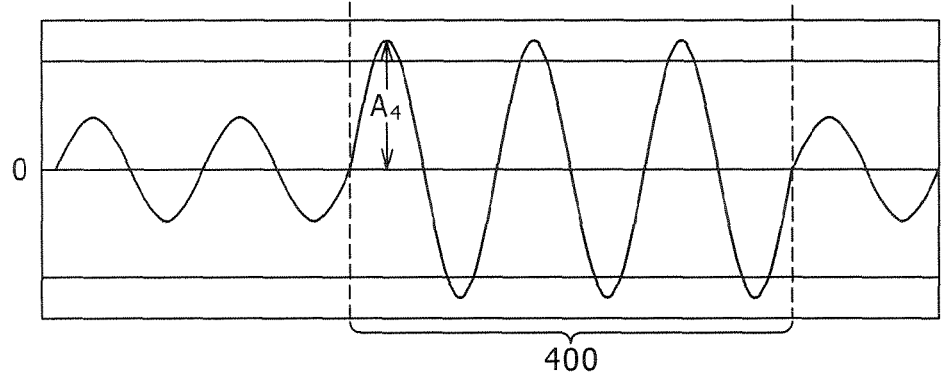
(AUDIO SIGNAL MEMORY)

FIG. 10
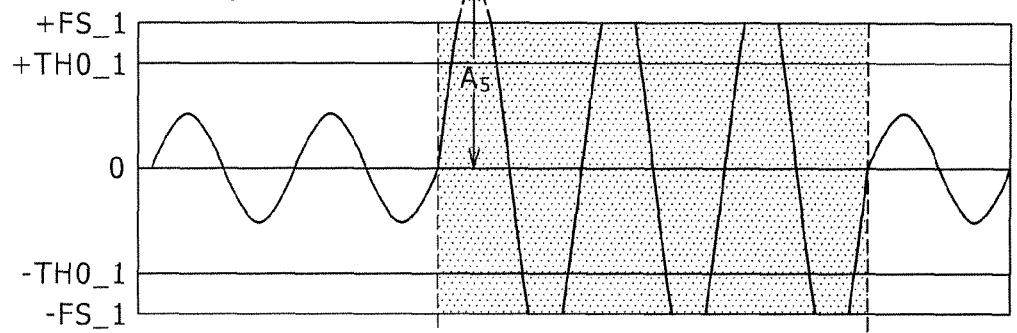
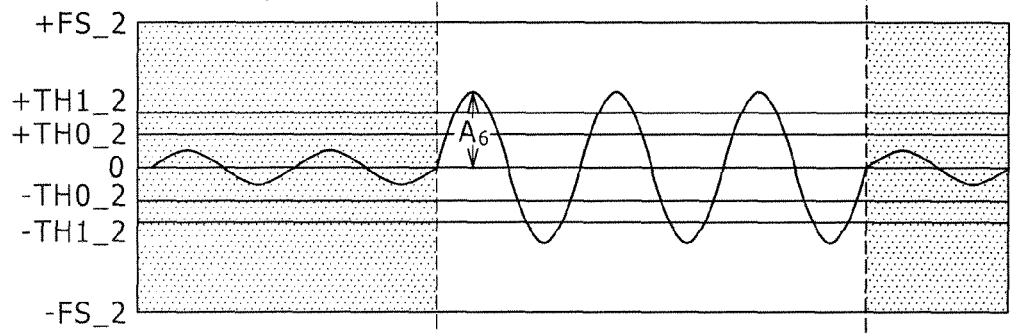
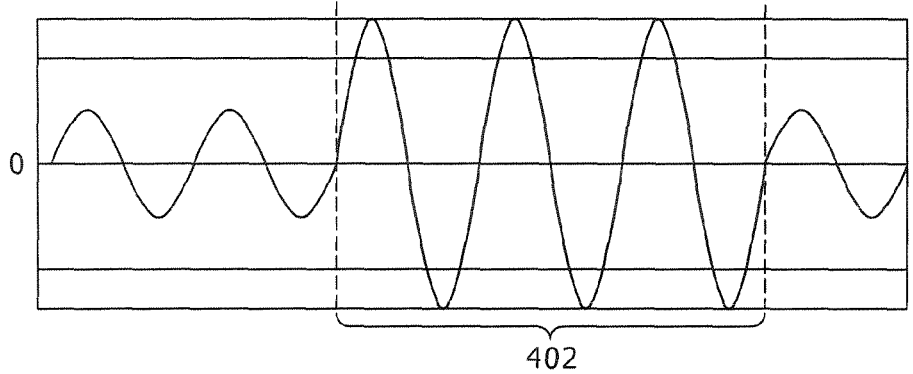

FIG.11
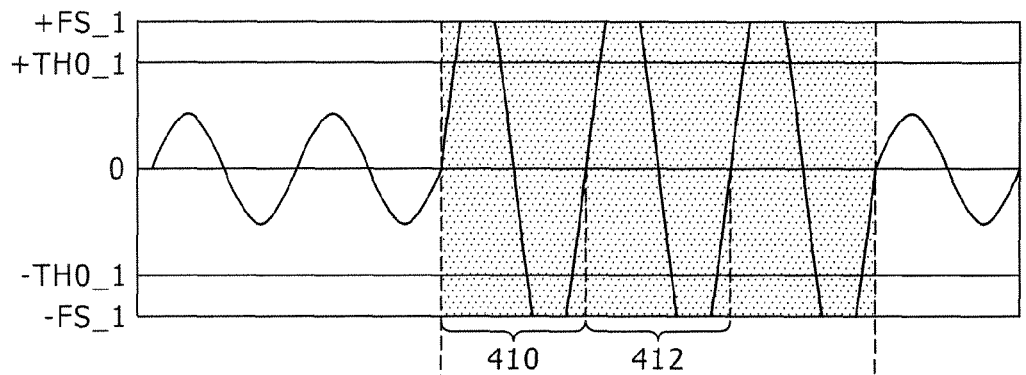
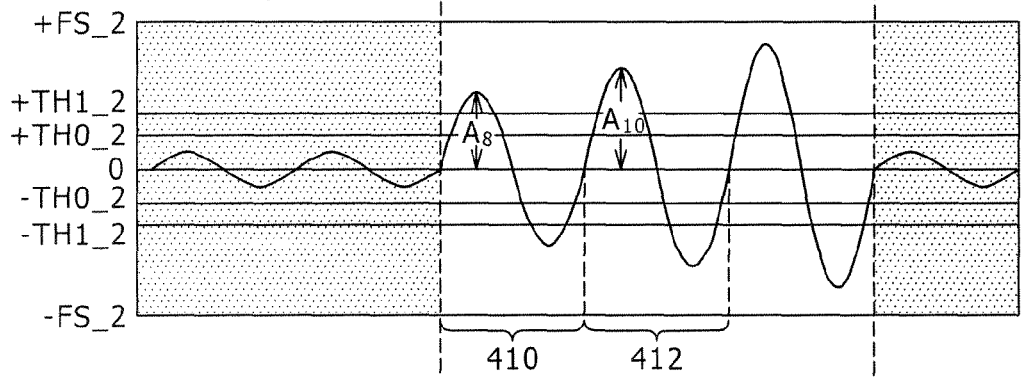
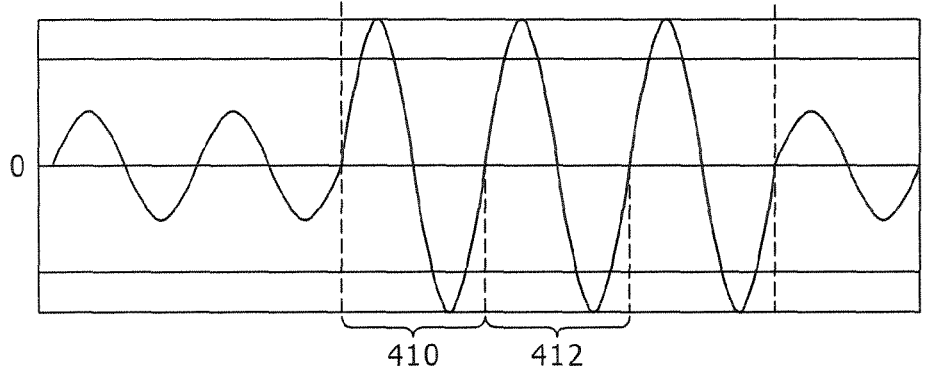

FIG.12
(FIRST MEMORY)
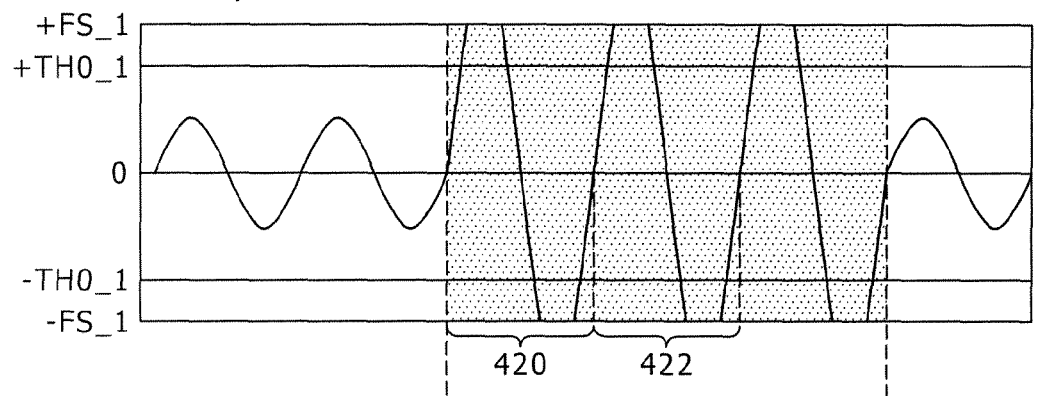
(SECOND MEMORY)
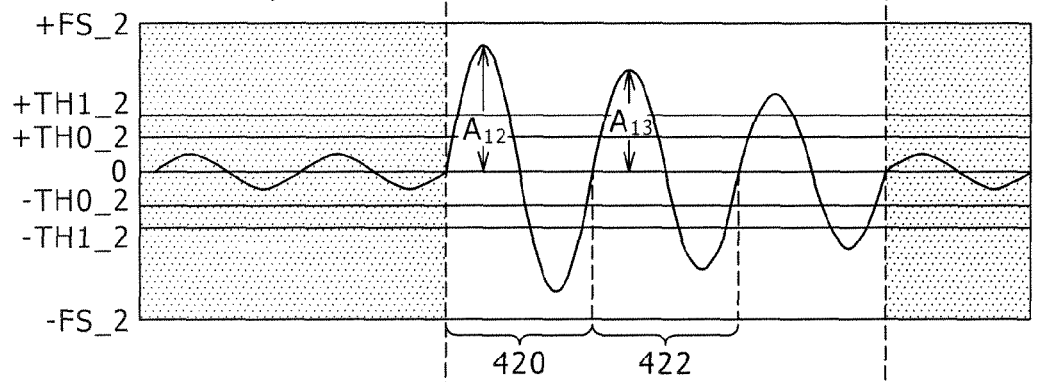
(AUDIO SIGNAL MEMORY)
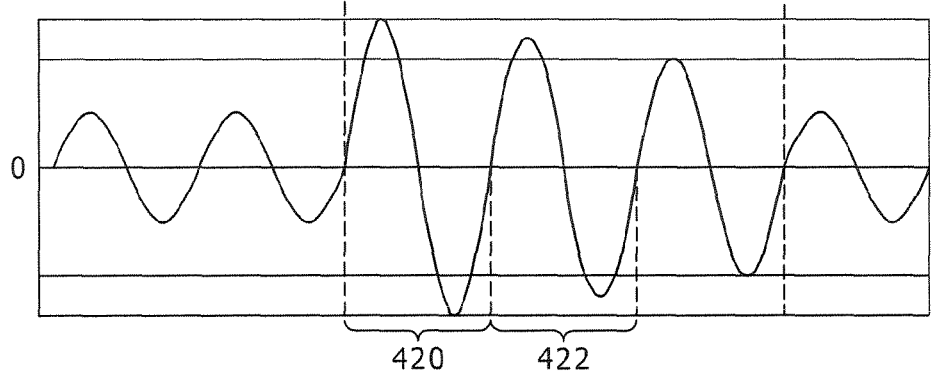

DIGITAL RECORDING DEVICE, DIGITAL RECORDING METHOD, PROGRAM, AND STORAGE MEDIUM

CROSS REFERENCES TO RELATED APPLICATIONS

The present invention contains subject matter related to Japanese Patent Application JP 2005-324019 filed with the Japanese Patent Office on Nov. 8, 2005, the entire contents of which being incorporated herein by reference.

BACKGROUND OF THE INVENTION

1. Field of the Invention

The present invention relates to a digital recording device, a digital recording method, a program, and a storage medium, and for example to a digital recording device, a digital recording method, a program, and a storage medium that can continuously store sound such as voice or the like.

2. Description of the Related Art

The storage capacity of general-purpose memories has recently been increasing at a tremendous pace. Against a background of limitations of memory capacity thus being removed, things that have been processed in analog form in the past are being digitized daily. For example, there has been a shift from a recording method that records an audio signal of voice or the like as an analog signal as it is to a recording method that once converts an audio signal into a digital signal and stores the digital signal in a high-capacity memory. A digital audio signal thus recorded digitally is free from storage medium degradation in sound quality with the passage of time, and allows a high-speed digital transfer to be used when duplicates are made.

In a digital recording device, there is a limit to quantization accuracy, and therefore where to set a dynamic range as a recording range becomes a problem. When the dynamic range is set too low, a high sound volume exceeding the dynamic range, that is, a high sound volume higher than 0 dB causes saturation in an AD (Analog to Digital) converter, so that sound quality cannot be ensured. When the dynamic range is set high, low-level sound cannot be picked up, and thus necessary audio signals may be lost.

As a measure to solve the above problem, a technique is known which uses an AD converter having a wide dynamic range and changes stepwise a limiter characteristic or an attenuation characteristic according to input level (for example Japanese Patent Laid-Open No. Hei 8-55428). Such a technique shifts stepwise an input signal according to change in input level, and can thereby maintain sound quality even for a high sound volume input.

SUMMARY OF THE INVENTION

However, the above-described technique needs an AD converter having a wide dynamic range, that is, an expensive AD converter, and the variation range of the dynamic range may not be set too wide considering a dynamic range necessary to maintain sound quality. In addition, since the input signal is attenuated stepwise according to change in input level, a time delay occurs, a sufficient attenuation may not be obtained for a sudden high sound volume, and it is difficult to ensure sound quality.

The present invention has been made in view of the above problems of the digital recording method in the related art, and it is desirable to provide a new and improved digital recording device, a digital recording method, a program, and a storage medium that make it possible to record sound while maintaining the quality of the sound regardless of a sudden high sound volume or the magnitude of level of the sudden high sound volume.

According to an embodiment of the present invention, there is provided a digital recording device includes a microphone, a first AD converter, a first memory, an attenuator, a second AD converter, a second memory, an audio signal generating unit, and an audio signal memory. The microphone is configured to convert collected sound into an analog audio signal. The first AD converter is configured to convert the analog audio signal converted by the microphone into a digital audio signal. The first memory is configured to store the digital audio signal of the first AD converter. The attenuator is configured to attenuate the analog audio signal with a predetermined attenuation factor. The second AD converter is configured to convert the attenuated analog audio signal into a digital audio signal. The second memory is configured to store the digital audio signal of the second AD converter. The audio signal generating unit is configured to extract the digital audio signal in one of the first memory and the second memory for a required time range according to an amplitude maximum value of the digital audio signal, and generate a new digital audio signal. The audio signal memory is configured to store the generated digital audio signal. The predetermined attenuation factor of the attenuator may be $1/100$ (−40 dB).

The digital recording device has input means of two systems, that is, a system in which an analog audio signal having a normal level is input and a system in which an analog audio signal having a sufficiently attenuated level is input. The audio signals from the input means of the two systems are stored in the memories simultaneously and independently of each other. Then, the audio signal generating unit combines the digital audio signals from the memories storing the digital audio signals independently of each other to generate a string of digital audio signals. The memory from which to extract the digital audio signal is determined on the basis of whether the sound quality of the audio signal input at a normal level can be maintained or not. When it becomes difficult to maintain the sound quality with the normal level due to a saturation of the AD converter, the audio signal input at an attenuated level is extracted.

In addition, the attenuator can provide a sufficient difference of a variation range of the dynamic range to the input levels of the two systems, thus making it possible to maintain sound quality without distorting a waveform even for an audio signal of high sound volume. Further, there is no particular need to prepare an expensive AD converter having a wide dynamic range.

The new digital audio signal may be extracted for a time range from a preceding zero crossing point immediately before an amplitude maximum time point. The time range may be formed in a unit of a cycle of the wave of the audio signal.

When the audio signal generating unit extracts the digital audio signal in one of the first memory and the second memory for a required time range, a discontinuity of amplitude may occur because of a difference of a conversion range of the dynamic range (attenuation factor). At a zero crossing point, however, the amplitude is not affected by the difference of the conversion range. Hence, by tracing back to a zero crossing point immediately before an amplitude maximum time point and performing the extraction, the audio signal generating unit can obtain a continuous audio signal waveform without a delay and without distortion of sound.

The audio signal generating unit may extract a digital audio signal from the first memory when the amplitude maximum value of the digital audio signal is within a measurement range of the first AD converter, and extract a digital audio signal from the second memory, and then generate a new digital audio signal when the amplitude maximum value of the digital audio signal is outside the measurement range of the first AD converter.

When the amplitude maximum value of the digital audio signal is outside the measurement range of the first AD converter, the digital audio signal stored in the first memory is saturated, and therefore the sound quality of the digital audio signal of the first AD converter may no longer be maintained. In such a time range, the sound quality can be maintained by referring to the digital audio signal of the second memory having a wide dynamic range.

When extracted from the second memory, the digital audio signal in the second memory may be multiplied by (Measurement Range of First AD Converter/Amplitude Maximum Value of Digital Audio Signal).

With such a constitution, the digital audio signal attenuated by the predetermined attenuation factor can be represented with the amplitude maximum value of the measured digital audio signal, and the dynamic range can be used effectively. Thus, sound quality can be maintained without giving a sense of incongruity.

When the amplitude maximum value of the digital audio signal is within the measurement range of the first AD converter but is outside a predetermined threshold range, the audio signal generating unit may extract the digital audio signal from the second memory, and multiply the digital audio signal in the second memory by (1/Attenuation Factor) when extracting the digital audio signal from the second memory.

By additionally providing a stage where the amplitude maximum value of the digital audio signal is within the measurement range of the first AD converter but is outside the predetermined threshold range, an intermediate process can be inserted at a time of extraction switching between the first memory and the second memory, so that the switching is performed smoothly.

When a next amplitude maximum value is lower than the above amplitude maximum value, a gradually decreasing function that provides one at a previous amplitude maximum time point may be calculated, and the digital audio signal in the second memory may be multiplied by (Measurement Range of First AD Converter/Amplitude Maximum Value of Digital Audio Signal×Gradually Decreasing Function) when extracted from the second memory.

The gradually decreasing function gradually decreases a scale factor for the digital audio signal in the second memory. Therefore, a gradual return can be made to normal level (within the measurement range of the first AD converter), and a sense of sound decrease can be enhanced.

The gradually decreasing function may be reset to one when the amplitude maximum value is higher than Previous Amplitude Maximum Value×Gradually Decreasing Function. It is possible to apply a scale factor multiplied by the gradually decreasing function to a region where the amplitude maximum value is decreasing as described above, and not to apply the scale factor to a region where the amplitude maximum value is increasing. When the amplitude maximum value increases, the gradually decreasing function is reset to one, so that the gradually decreasing function for a next region where the amplitude maximum value is decreasing can be started at one.

After the new digital audio signal is generated, memory areas for the time range in the first memory and the second memory may be set in a state allowing overwriting.

After the new digital audio signal is generated, contents in the first memory and the second memory become unnecessary. Thus, both the memories can be overwritten any number of times, and the memory capacity of both the memories can be reduced.

According to an embodiment of the present invention, there is provided a digital recording method includes a first converting step, a first memory storing step, a second converting step, a second memory storing step, and an audio signal generating step. The first converting step is converting an analog audio signal from a microphone, the microphone converting collected sound into the analog audio signal, into a digital audio signal. The first memory storing step is storing the converted digital audio signal in a first memory. The second converting step is converting an analog audio signal obtained by attenuating the analog audio signal with a predetermined attenuation factor into a digital audio signal in parallel with the first memory storing step. The second memory storing step is storing the digital audio signal of the second converting step in a second memory. The audio signal generating step is extracting the digital audio signal in one of the first memory and the second memory for a required time range according to an amplitude maximum value of the digital audio signal, generating a new digital audio signal, and storing the generated new digital audio signal in an audio signal memory.

In addition, a program for making a computer perform the above-described digital recording method and a storage medium on which the program is stored are provided.

As described above, according to the present invention, it is possible to record even a sudden high sound volume while maintaining the quality of the sound without distorting the audio signal.

BRIEF DESCRIPTION OF THE DRAWINGS

FIG. 8 is a timing chart showing processing of the audio signal generating unit;

FIG. 9 is a timing chart showing processing of the audio signal generating unit;

FIG. 10 is a timing chart showing processing of the audio signal generating unit;

FIG. 11 is a timing chart showing processing of the audio signal generating unit;

FIG. 12 is a timing chart showing processing of the audio signal generating unit;

DETAILED DESCRIPTION OF THE PREFERRED EMBODIMENTS

Figure 1:
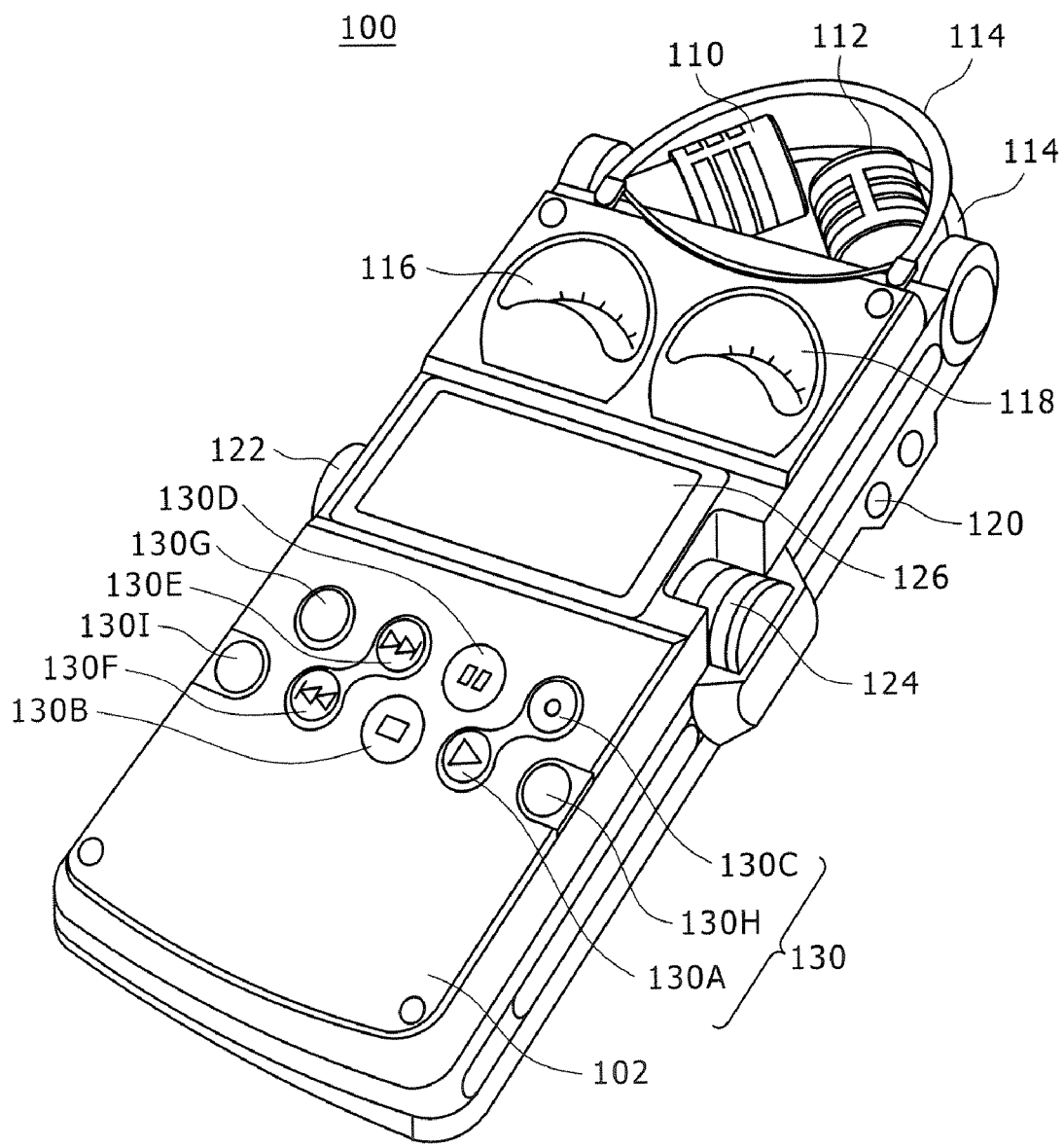
FIG. 1 is an external view showing an external appearance of a digital recording device.

Preferred embodiments of the present invention will hereinafter be described in detail with reference to the accompanying drawings. Incidentally, in the present specification and the drawings, components having substantially identical functional constitutions are identified by the same reference numerals, and repeated description thereof will be omitted.

As technology for storing and reproducing an audio signal of sound or the like, there is a digital recording system that once converts the audio signal into a digital signal and stores the digital signal in a high-capacity memory. In such a digital recording system, the audio signal once digitized at the time of recording the sound is reconverted into an analog signal, and then the analog signal is output.

In such a digital recording system, there is a limit to quantization accuracy of an AD converter in converting an analog signal into a digital signal, and it becomes a problem to determine where to set a dynamic range of the AD converter. When the dynamic range is set low, a high sound volume higher than 0 dB brings about a saturation of the AD converter. When the dynamic range is set high, low-level sound may not be picked up.

When it is a problem of only the dynamic range, the problem can be solved by simply heightening the resolution of the AD converter. However, heightening the resolution of the AD converter not only increases the cost of the AD converter, but also results in consumption of a large amount of memory, and in return for this, an audio signal recording time needs to be shortened.

There is a technique that changes stepwise a limiter characteristic or an attenuation characteristic according to input level. However, since an input signal is attenuated stepwise, a time delay of 10 msec, for example, occurs, a sufficient attenuation may not be obtained for a sudden high sound volume, a waveform is distorted, and it is difficult to ensure sound quality thereof.

Figure 17:
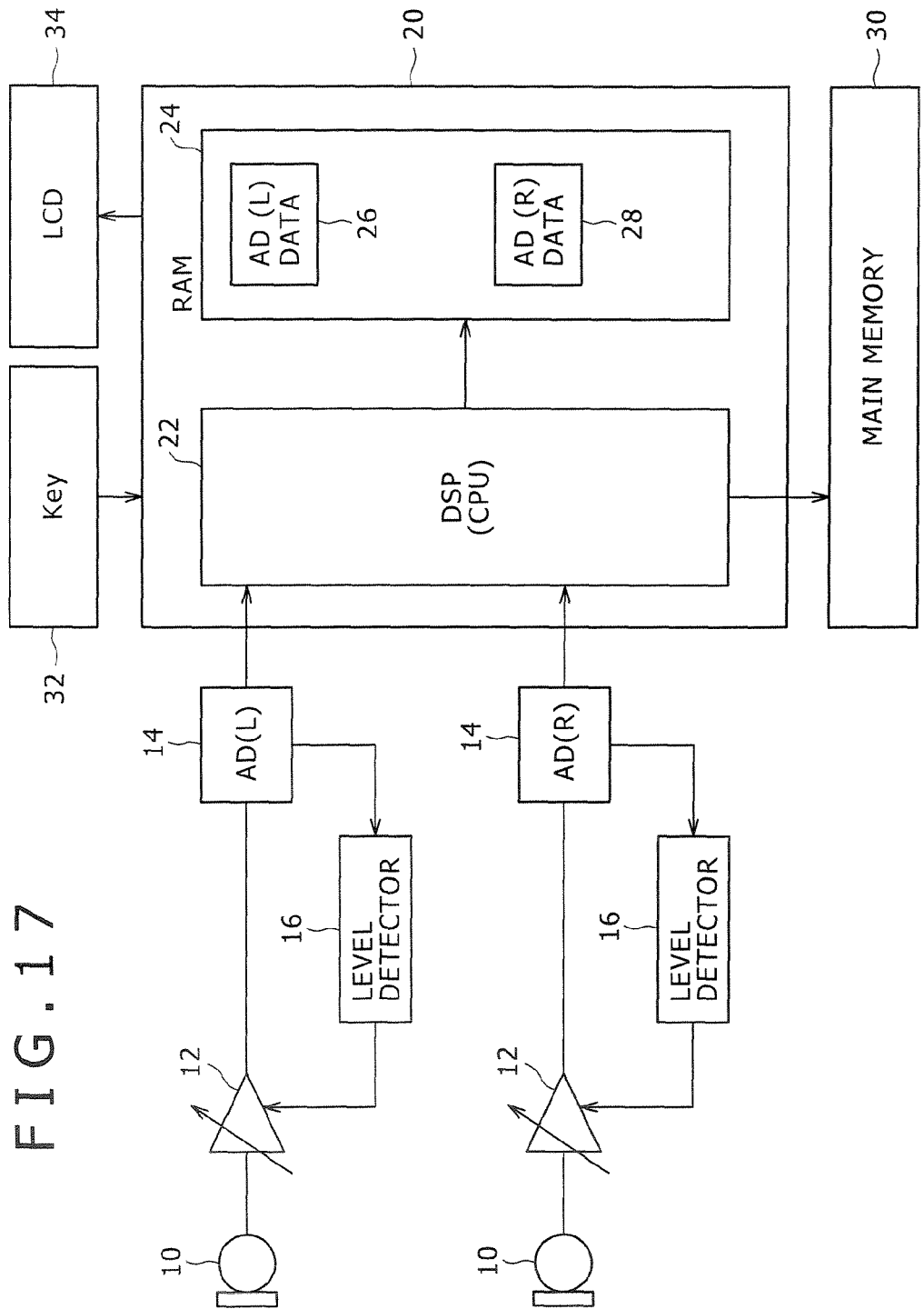
FIG. 17 is a block diagram schematically showing a circuit configuration for a recording function of a digital recording device in the related art.

FIG. 17 is a block diagram schematically showing a circuit configuration related to a recording function of such a digital recording device in the related art. The digital recording device converts sound collected by a microphone into an analog audio signal, converts the analog audio signal into a digital audio signal, temporarily stores the digital audio signal in a RAM, and then transfers the digital audio signal to a main memory. A flow of such an electric signal will be concretely described in the following.

First, the microphone 10 of the digital recording device collects sound around the microphone 10, and converts the sound into an analog electric signal (analog audio signal). As the microphone 10, a dynamic microphone using a diaphragm and a voice coil, a capacitor microphone in which a diaphragm and a capacitor are formed integrally with each other, or the like is applied. A capacitor microphone tends to be applied to a small device such as the digital recording device, in particular.

The analog audio signal output from the microphone 10 is input to an AD converter 14 via an AGC (Auto Gain Controller) 12. While the resolution of the AD converter 14 can be selected arbitrarily, the resolution of the AD converter is generally represented by a power of two; in this case, 32-bit is applied.

The analog audio signal sampled in the AD converter 14 is converted into a 32-bit digital audio signal. The digital audio signal is transmitted to a DSP (Digital Signal Processor) 22 within a data processing unit 20. At this time, in parallel with the converting process, the AD converter 14 transmits an absolute magnitude of the analog audio signal as an analog or digital signal to a level detector 16.

The level detector 16 adjusts the gain of the AGC 12 according to the magnitude of the audio signal, whereby the AD converter 14 can obtain the analog audio signal having an appropriate level. The digital audio signal thus adjusted to an appropriate level is transmitted to the DSP 22. The DSP 22 further performs processing such as filtering or the like, and then stores the audio signal in a RAM 24.

As shown in FIG. 17, the digital recording device has a microphone for collecting sound in a right direction and a microphone for collecting sound in a left direction. Digital audio signals generated from the sound in the two directions are stored in the RAM 24 independently of each other. Hence, the RAM 24 has an area 26 for storing the left-direction digital audio signal and an area 28 for storing the right-direction digital audio signal. The thus stored digital audio signals are finally transferred to a main memory 30.

An instruction for starting recording an audio signal, ending the recording or the like and a specification of a folder in which to store the audio signal or the like are performed using a key 32. Whether the instruction or the specification is correctly recognized by the digital recording device can be checked on an LCD (Liquid Crystal Display) 34.

As a further function, such a digital recording device can change stepwise an attenuation characteristic of each audio signal input path when an input of a high sound volume is detected during recording, and thereby provide a digital audio signal adjusted to the high sound volume.

Figure 18A:
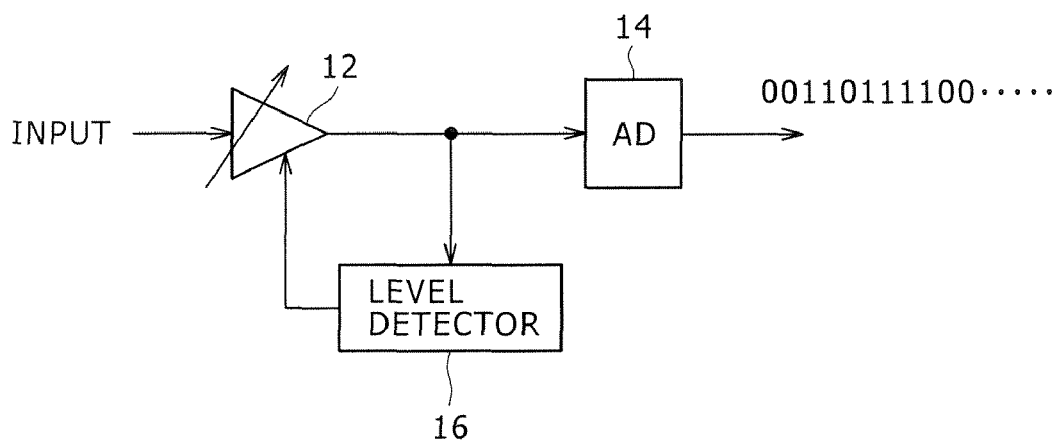
FIG. 18A is a diagram of assistance in explaining an attenuation characteristic with a concrete circuit configuration.
Figure 18B:
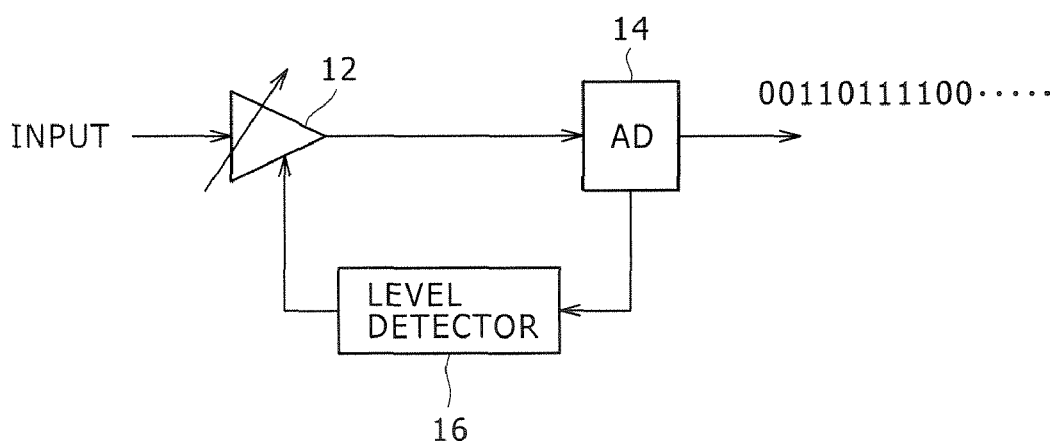
FIG. 18B is a diagram of assistance in explaining an attenuation characteristic with a concrete circuit configuration.

FIGS. 18A and 18B are diagrams of assistance in explaining such an attenuation characteristic with a concrete circuit configuration. In FIG. 18A, an analog audio signal from the AGC 12 is output to the level detector 16. In FIG. 18B, a digital audio signal after conversion in the AD converter 14 is output to the level detector 16.

The level detector 16 adjusts the gain of the AGC 12 according to the magnitude of amplitude of the analog audio signal or the digital audio signal. Specifically, when the audio signal is increased in amplitude, the level detector 16 decreases the gain of the AGC 12 gradually or stepwise. When the audio signal is decreased in amplitude, the level detector 16 increases the gain of the AGC 12 gradually or stepwise.

The digital recording device in the related art performs a limiter function or an attenuation function by the level detector 16 and the AGC 12.

Figure 19A:
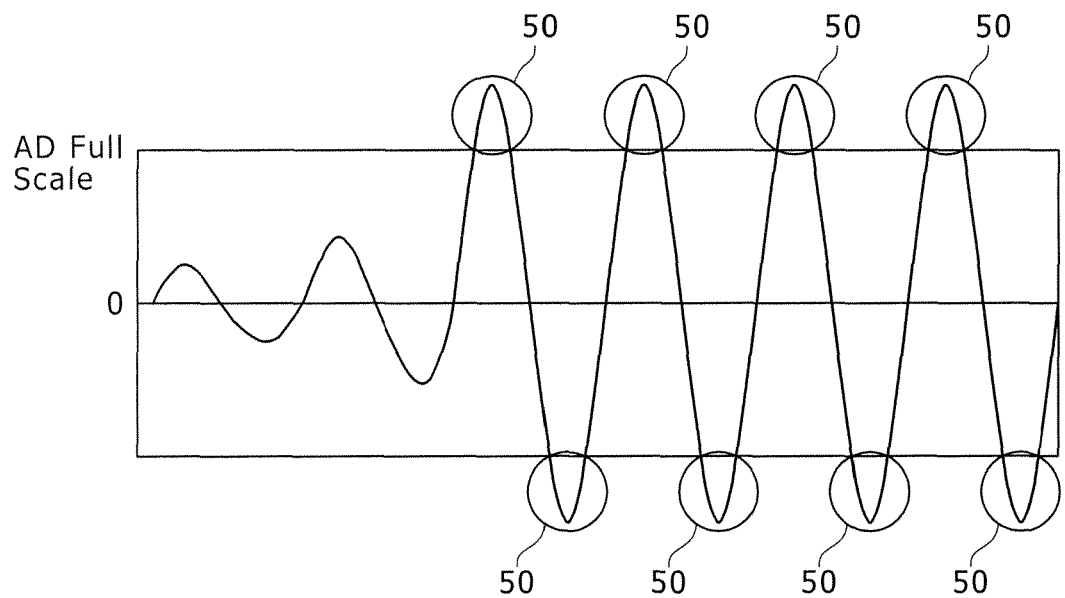
FIG. 19A is a timing chart of assistance in explaining the attenuation characteristic of the digital recording device in the related art.
Figure 19B:
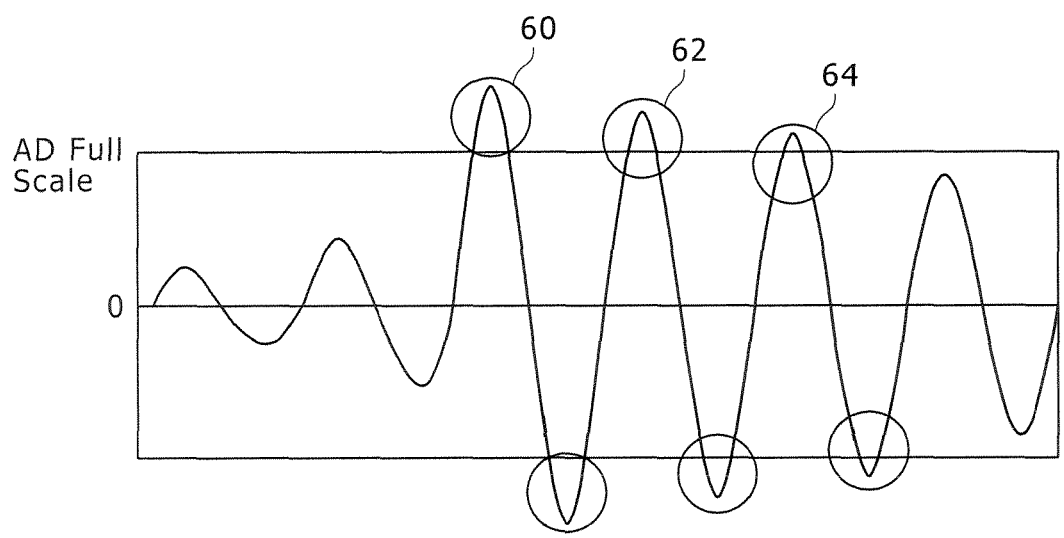
FIG. 19B is a timing chart of assistance in explaining the attenuation characteristic of the digital recording device in the related art.

FIGS. 19A and 19B are timing charts of assistance in explaining the attenuation characteristic of the digital recording device in the related art. FIG. 19A shows the input signal of the microphone. FIG. 19B shows the input signal of the AD converter 14. Suppose that the audio signal as shown in FIG. 19A is input. When the audio signal 50 of a high sound volume outside the dynamic range of the AD converter 14 is input from a certain point in time, the level detector 16 of the digital recording device in the related art attenuates the input signal stepwise in response to the input level change.

However, since the level detector 16 decreases the gain of the AGC 12 stepwise, the input signal of the AD converter 14 is gradually attenuated as shown in FIG. 19B. The amplitude of the audio signal is gradually decreased from a first amplitude maximum value 60 to a next amplitude maximum value 62 to an amplitude maximum value 64, and finally falls within the dynamic range of the AD converter 14.

The method of adjusting the gain of the AGC 12 as described above does not perform the attenuation process in response to a sudden high sound volume as shown in FIG. 19A until the amplitude exceeds a threshold value, and therefore may not provide a sufficient attenuation immediately. Thus, at points in time 60, 62, and 64, saturation of the input amplitude of the AD converter 14 occurs, and the waveform of the input amplitude of the AD converter 14 is distorted.

Embodiments of the present invention solve problems in the related art such as a delay in the dynamic range of the audio signal and the inability to provide a sufficient attenuation as described above, and provide a digital recording device that can record sound while maintaining the quality of the sound regardless of a sudden high sound volume or the magnitude of level of the sudden high sound volume. A digital recording device according to an embodiment of the present invention will be described below in detail.

First Embodiment

Digital Recording Device 100

FIG. 1 is an external view showing an external appearance of a digital recording device 100. The digital recording device 100 referred to commonly as an IC (Integrated Circuit) recorder as shown in FIG. 1 is formed so as to be of a small size and a light weight to be carried to various places by a user, and is able to record various sounds.

The digital recording device 100 includes a microphone 110 for a right channel, a microphone 112 for a left channel, a metallic cover 114, a VU (Volume Unit) meter 116 for the left channel, a VU meter 118 for the right channel, a headphone terminal 120, a volume adjusting knob 122, a recording level adjusting knob 124, an LCD 126, and an operating button group 130 from the top of a casing 102 on a surface of the casing 102.

The microphone 110 for the right channel and the microphone 112 for the left channel collect sound around the digital recording device 100 in directions in which the respective microphones are directed, independently of each other. The metallic cover 114 is formed of an arc-shaped metallic material in such a manner as to cover the microphone 110 for the right channel and the microphone 112 for the left channel. The metallic cover 114 protects both the microphones 110 and 112.

The VU meter 116 for the left channel and the VU meter 118 for the right channel indicate the sound volumes of the sounds collected by the microphones 110 and 112 for the right and left channels. The headphone terminal 120 is an output terminal of a recorded audio signal. The volume adjusting knob 122 allows the output sound volume of the audio signal to be adjusted.

The recording level adjusting knob 124 is a knob for adjusting the input level of an audio signal in the digital recording device 100. The recording level adjusting knob 124 allows the user to freely adjust the input level according to conditions of recording of the audio signal. For example, when an input of high sound volume is expected, the user lowers the input level (sensitivity). When low-volume sound is desired to be collected, the user raises the input level. Generally, the input level is often set to about −12 dB with respect to the full scale of the input level.

The LCD 126 displays a guide to performing various functions including a recording function, the absolute value of the sound volume adjusted by the volume adjusting knob 122, and the like.

The operating button group 130 is divided into a reproduction button 130A, a stop button 130B, a recording button 130C, a pause button 130D, a fast-forward button 130E, a fast-reverse button 130F, a menu button 130G, a file dividing button 130H, and a lighting button 130I. The operating button group 130 receives an operation desired by the user.

The digital recording device 100 can receive a stereo (two-channel) input of sound such as voice or the like using an AD converter having capabilities of for example a sampling rate of 96 [kHz] and quantization bit rate of 32-bit, further encode the sound into data having a high bit rate of 4.6 [Mbps], and store the data as a non-compressed file in a WAV format. With such a configuration, the digital recording device 100 can record sound of which high sound quality may required, such as sound of a musical instrument being played, a singing voice of a person, and the like, with high sound quality.

Description will next be made of an overall electric flow in the digital recording device 100.

Figure 2:
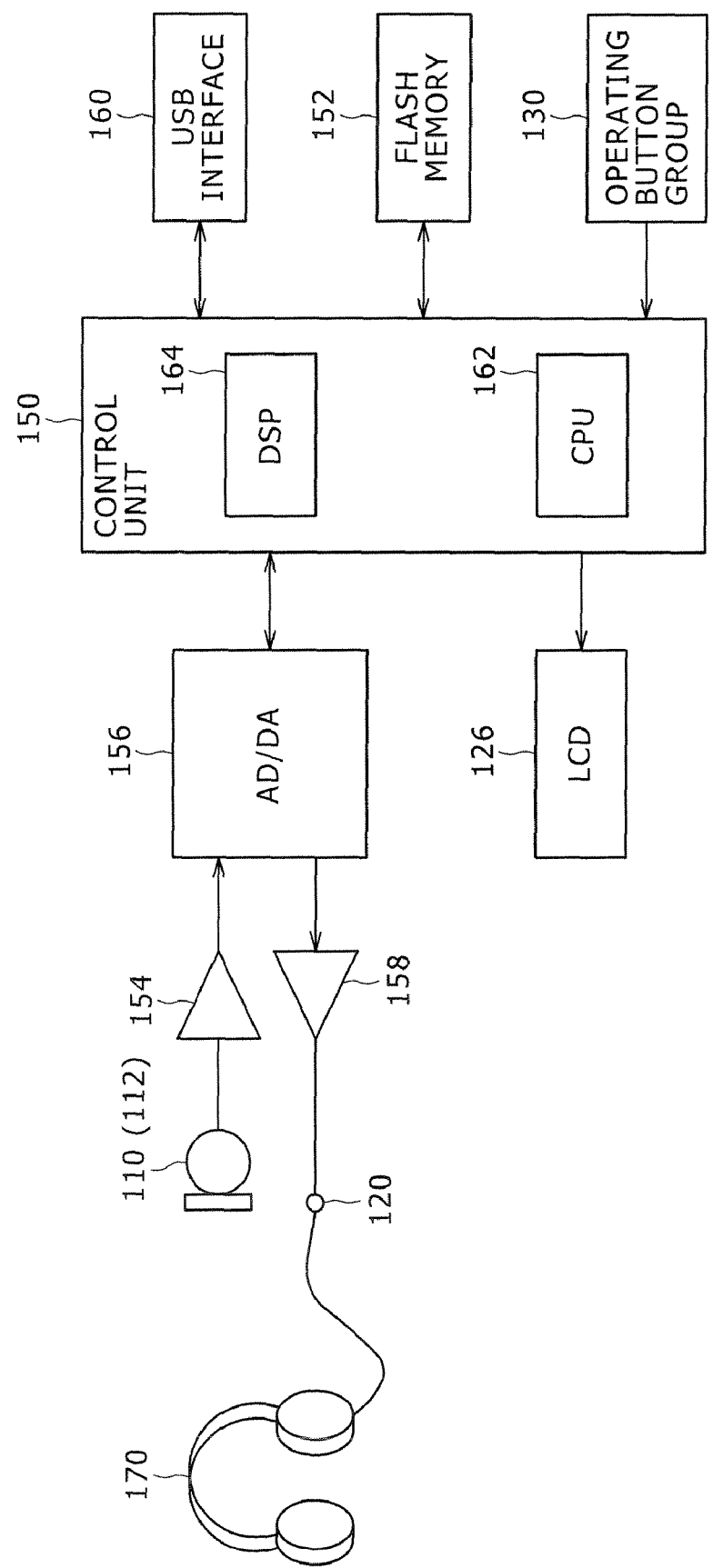
FIG. 2 is a block diagram showing a general circuit configuration of the digital recording device.

FIG. 2 is a block diagram showing a general circuit configuration of the digital recording device 100. The digital recording device 100 includes a control unit 150, the operating button group 130, the microphone 110 for the right channel, the microphone 112 for the left channel, a flash memory 152, a microphone amplifier 154, an AD/DA converter 156, the LCD 126, a headphone amplifier 158, and a USB interface 160.

The control unit 150 includes a CPU (Central Processing Unit) 162 and a DSP (Digital Signal Processor) 164. The control unit 150 controls the whole of the digital recording device 100. The CPU 162 recognizes the various buttons 130A to 130I in the operating button group 130 which buttons are pressed by the user, and performs a process according to the operation.

For example, when the user presses the recording button 130C, the CPU 162 creates an audio file in the WAV format which file has a file name corresponding to a date and a time when the user presses the recording button 130C, for example, in the flash memory 152, and opens the audio file to store a digital audio signal.

According to an instruction to start recording from the user, the CPU 162 starts supplying power to the microphone 110 for the right channel and the microphone 112 for the left channel to collect sound of surroundings (voice, sound of a musical instrument, or the like). The thus collected sound is converted into an analog audio signal, then input to the AD/DA (Analog to Digital/Digital to Analog) converter 156 via the microphone amplifier 154, and transmitted as a digital audio signal to the DSP 164.

The DSP 164 subjects the input digital audio signal to linear coding processing in each predetermined time unit, and integrates data for the two channels into one piece of data, thereby generating coded data of a linear PCM (Pulse Code Modulation) system The DSP 164 sequentially stores the coded data in the flash memory 152. At this time, the CPU 162 stores the coded data in an audio file of the flash memory 152, and increases the file size of the audio file.

When an audio signal that is being recorded or has been recorded is to be reproduced, the user presses the reproduction button 130A while referring to the LCD 126, the DSP 164 loads a digital audio signal from an audio file stored in the flash memory 152 in response to the operation of the user, and the AD/DA converter 156 converts the digital audio signal into an analog audio signal. The thus generated analog audio signal is transmitted to external headphones 170 via the headphone amplifier 158 and the headphone terminal 120. The user can listen to the audio signal from the headphones 170.

When the CPU 162 recognizes that the USB (Universal Serial Bus) interface 160 is connected to a personal computer by a USB cable (not shown), the CPU 162 automatically changes an operation mode from an "independent operation mode", in which the digital recording device 100 can singly perform the above-described recording process and the like, to a "storage mode". Thus, the flash memory 152 can be used as a storage external to the personal computer, and recognized as one drive by an OS (Operating System).

At this time, the personal computer can recognize an audio file stored in the flash memory 152 as a normal audio file in the WAV format.

When the CPU 162 thereafter recognizes that the USB cable (not shown) is detached from the USB interface 160, the CPU 162 automatically returns the operation mode from the "storage mode" to the "independent operation mode", so that the digital recording device 100 can singly perform various processes such as the above-described recording process and the like.

Figure 3:
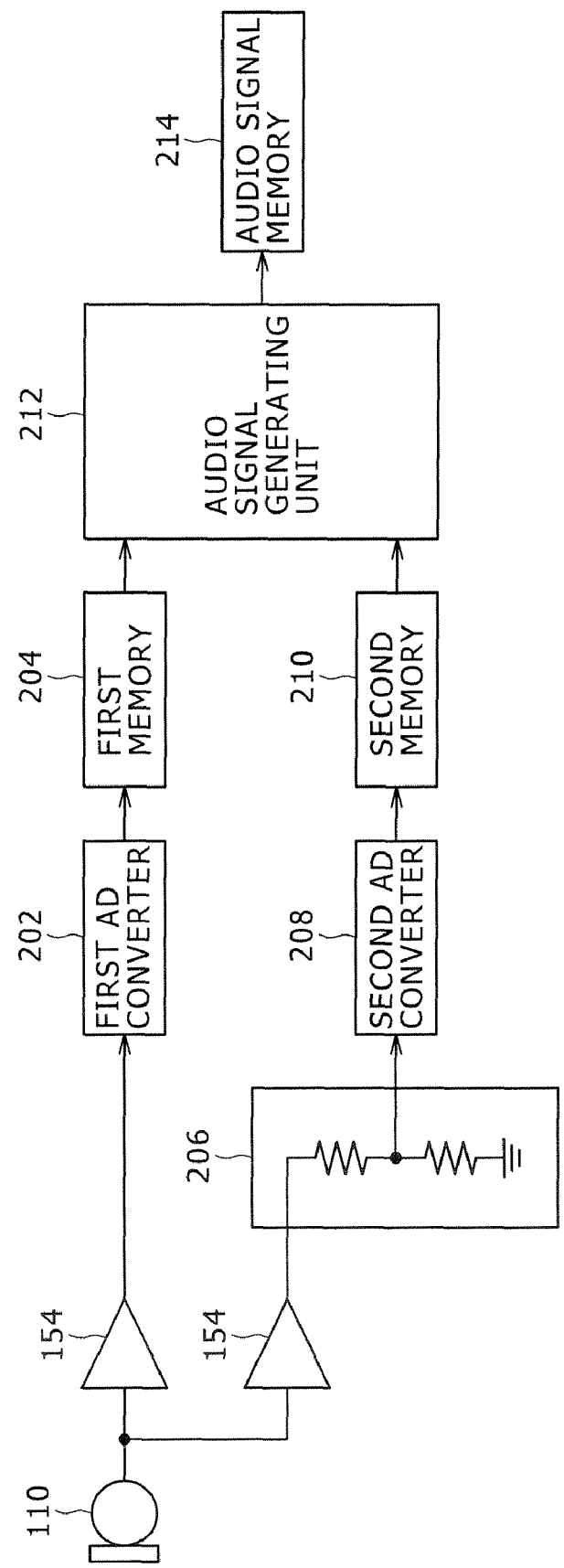
FIG. 3 is a functional block diagram showing in detail characteristic parts of the digital recording device according to a first embodiment.

FIG. 3 is a functional block diagram showing in detail characteristic parts of the digital recording device 100 according to the first embodiment. A recording block for the recording process of the digital recording device 100 includes the microphone 110, the microphone amplifier 154, a first AD converter 202, a first memory 204, an attenuator 206, a second AD converter 208, a second memory 210, an audio signal generating unit 212, and an audio signal memory 214.

As shown in FIG. 3, the digital recording device 100 has input means of two systems, that is, a system in which an analog audio signal having a normal level is input via the first AD converter 202 and a system in which an analog audio signal sufficiently attenuated by the attenuator 206 is input. The audio signals from the input means of the two systems are respectively stored in the first memory 204 and the second memory 210 simultaneously and independently of each other. Then, the audio signal generating unit 212 combines the digital audio signals from the respective memories 204 and 210 with each other to generate a string of digital audio signals.

In the present embodiment, the inputs of two such systems are provided independently of each other. Thereby, even when such a high sound volume as exceeds a scale in the AD converter is input, a ultimately recorded audio signal is not distorted, and as wide a dynamic range as possible is adapted to the audio signal, so that the sound quality of the audio signal is maintained.

The function of each component will be described below in detail. The microphone 110 and the microphone amplifier 154 have already been described, and thus description below will be made mainly of the first AD converter 202, the first memory 204, the attenuator 206, the second AD converter 208, the second memory 210, the audio signal generating unit 212, and the audio signal memory 214 that form a different constitution.

The first AD converter 202 is formed by an analog-to-digital converter having a resolution of 32-bit based on a $\Delta\Sigma$ (delta sigma) system, for example. The first AD converter 202 converts an analog audio signal converted by the microphone 110 and input via the microphone amplifier 154 into a digital audio signal. The sampling rate of the first AD converter 202 can be set to 44.1 kHz or 96 kHz, for example. Hence, the sampling period of the first AD converter 202 is about 10 to 23 μsec.

Such a 32-bit first AD converter 202 has a dynamic range of 193 dB, and has a sufficient resolution to pick up sounds of 0 to 120 dB, which represent levels of sound pressure perceived as sound by a human.

The first memory 204 is formed by a storage medium such as a RAM (Random Access Memory), an $E^2$PROM (Electrically Erasable and Programmable Read Only Memory), a nonvolatile RAM, a flash memory, a card memory, a USB memory, an HDD (Hard Disk Drive) or the like. The first memory 204 stores the digital audio signal converted by the first AD converter 202.

The attenuator 206 attenuates the analog audio signal converted by the microphone 110 and input via the microphone amplifier 154 with a predetermined attenuation factor. High sound volumes occurring on a daily basis include for example high sound volumes of hand clapping and impulsive sound when an object falls. Because these high sound volumes can exceed 10 dB, the attenuation factor is set to $1/100$ (−40 dB when converted into voltage and −20 dB when converted into sound pressure level) to sufficiently cover the high sound volumes. However, the specific value of the attenuation factor is not limited to the above value; $1/128$ as a power of two may be applied to reduce a calculation load as described later, and various other numerical values can be applied. In addition, depending on a use of the digital recording device 100, a numerical value of one or more can be applied.

Such an attenuator 206 can provide a sufficient dynamic range variation range difference to the input levels of the two systems described above.

As with the first AD converter 202, the second AD converter 208 converts the analog audio signal attenuated by the attenuator 206 into a digital audio signal. The second AD converter 208 may be formed by an analog-to-digital converter identical to the first AD converter 202, or a converter having a different resolution may be intentionally used as the second AD converter 208. Further, the second AD converter 208 can be formed integrally with the first AD converter 202. For example, a semiconductor device having two AD converters on one chip can be used.

The second memory 210 is formed by a storage medium similar to that of the first memory 204. The second memory 210 stores the digital audio signal converted by the second AD converter 208. The second memory 210 is managed independently of the first memory 204. However, the areas of the two memories 204 and 210 may be provided on one storage medium, or may be provided on separate storage media.

The audio signal generating unit 212 extracts one of the digital audio signals in the first memory 204 and the second memory 210 for a required time range according to the amplitude maximum value of the digital audio signal input from the first AD converter 202, and combines the extracted digital audio signal to generate a new string of digital audio signals.

Viewing the new digital audio signal in time units, the new digital audio signal includes the digital audio signal of one of the memories at a same time (same point in time) without fail. Hence, the data of the two memories is processed exclusively at a same point in time. The memory from which to extract the digital audio signal is determined on the basis of whether the sound quality of the audio signal input at a normal level can be maintained or not. When it becomes difficult to maintain the sound quality due to a saturation of the AD converter, the attenuated audio signal, that is, the second memory 210 is selected.

The audio signal generating unit 212 may extract a digital audio signal from the first memory when the amplitude maximum value of the digital audio signal is within a measurement range of the first AD converter, and extract a digital audio signal from the second memory, and then generate a new digital audio signal when the amplitude maximum value of the digital audio signal is outside the measurement range of the first AD converter.

When the amplitude maximum value of the digital audio signal is outside the measurement range of the first AD converter, the digital audio signal stored in the first memory 204 is saturated, and therefore the sound quality of the digital audio signal may no longer be maintained. In a time range where the amplitude maximum value of the digital audio signal is outside the measurement range of the first AD converter 202, the sound quality can be maintained by referring to the digital audio signal of the second memory having a wide dynamic range.

Figure 4:
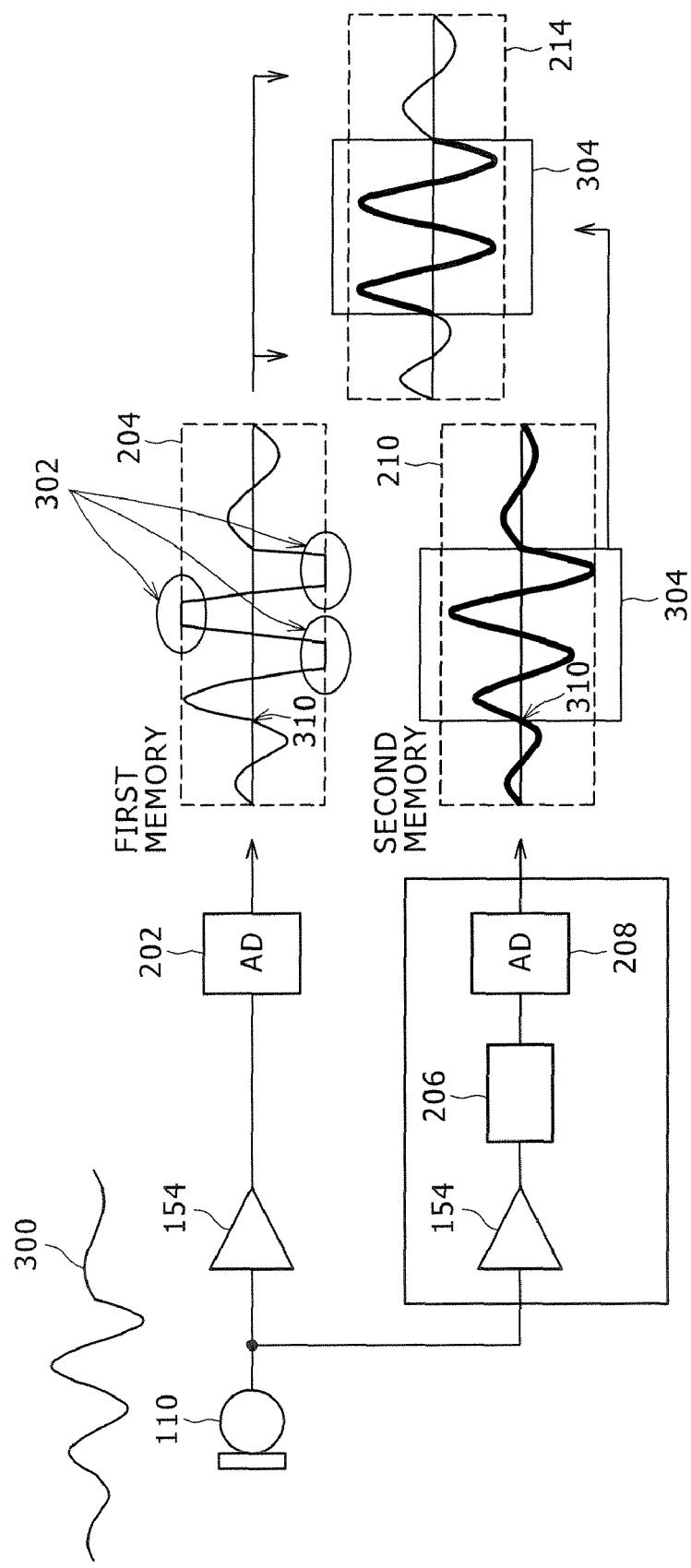
FIG. 4 is a diagram of assistance in explaining the processing of an audio signal generating unit.

FIG. 4 is a diagram of assistance in explaining the audio signal generating unit 212. Referring to FIG. 4, an analog audio signal 300 of sound or the like is input from the microphone 110, and then branches off into two systems, that is, a system in which the analog audio signal having a normal level is input via the first AD converter 202 and a system in which the analog audio signal sufficiently attenuated by the attenuator 206 is input.

The audio signals from the two systems are respectively digitized and stored in the first memory 204 and the second memory 210. In the system in which the analog audio signal having a normal level is input, the analog audio signal 300 has a part that exceeds the measurement range defined by the first AD converter 202. The first AD converter 202 may not sample accurate values for this part.

Accordingly, the system in which the analog audio signal 300 is input with a sufficiently attenuated level is used. Since the amplitude of the audio signal input to the second AD converter 208 in such a system is 1/100 of that of the first AD converter 202, the audio signal saturated in the first AD converter 202 can be measured. Hence, the second memory 210 retains the audio signal not distorted by a clip even when the audio signal represents a high sound volume.

While the attenuation factor of the attenuator 206 in the present embodiment is 1/100, the waveforms of the two memories 204 and 210 in FIG. 4 are represented with an attenuation factor of about 1/2 in order to facilitate understanding.

Then, the audio signal generating unit 212 generates a string of digital audio signals by combining the respective digital audio signals from the first memory 204 and the second memory 210 with each other. At normal times, the audio signal generating unit 212 transfers the digital audio signal from the first memory 204 to the audio signal memory 214 as it is. Hence, the audio signals in the first memory 204 and the audio signal memory 214 are formed equally.

However, during a period when the amplitude maximum value of the digital audio signal is in parts 302 outside the measurement range of the first AD converter 202, the digital audio signal 304 in the second memory 210 is filled into the audio signal memory 214. Thus, a final digital audio signal in the audio signal memory 214 has a form obtained by superimposing (overwriting) the digital audio signal 304 in the second memory 210 on the digital audio signal in the first memory 204.

At this time, the digital audio signal 304 in the second memory 210 for generating the new digital audio signal may be extracted for a time range from a preceding zero crossing point immediately before an amplitude maximum time point.

The present embodiment refers to the digital audio signal in the second AD converter 208 when the amplitude maximum value of the digital audio signal is in the parts 302 outside the measurement range of the first AD converter 202. However, when the audio signal generating unit 212 extracts one of the digital audio signals in the first memory 204 and the second memory 210 for a required time range, a discontinuity of amplitude occurs because of a difference of a conversion range of the dynamic range (attenuation factor). Hence, by tracing back to a zero crossing point 310 (FIG. 4) immediately before an amplitude maximum time point and performing the extraction, the audio signal generating unit 212 can obtain a continuous audio signal waveform without a delay and without distortion of sound.

When switching using such a zero crossing point is performed after the amplitude maximum time point, a delay is caused, thus distorting the amplitude at least for one period. Though it is not impossible with an analog circuit, considering the sampling speed of the digital recording device, it is effective to detect an accurate zero crossing point on an ex post basis, trace back to a time point before the amplitude maximum value exceeds the scale, and perform switching on the memories. It can be considered that because of such tracing back to a switching time point, a switching time constant is negative (minus).

Figure 5:
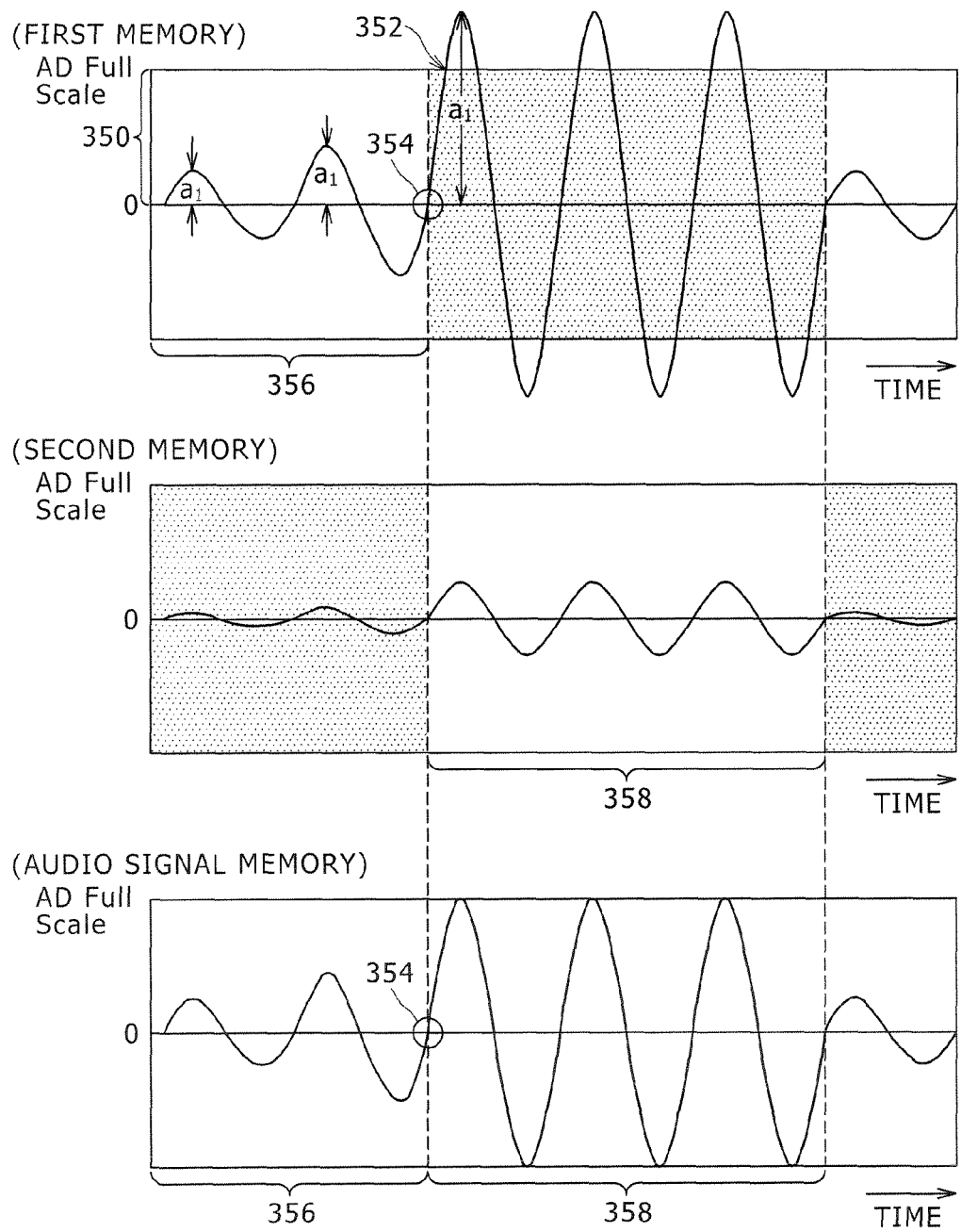
FIG. 5 is a timing chart showing temporal changes in a digital audio signal generated by the audio signal generating unit.

FIG. 5 is a timing chart showing temporal changes in the digital audio signal generated by the audio signal generating unit 212. The timing chart shows, from the top, the digital audio signal stored in the first memory 204, the digital audio signal stored in the second memory 210, and the digital audio signal stored in the audio signal memory 214. In each chart, an axis of ordinates indicates the amplitude value of the audio signal, and an axis of abscissas indicates a flow of time advancing from left to right. Similar timing charts to be presented in the following are shown under such settings.

While the amplitude maximum value $a_1$ of the digital audio signal is within the measurement range 350 of the first AD converter 202, the audio signal generating unit 212 extracts a digital signal from the first memory 204, and then transfers the digital audio signal to the audio signal memory 214. Thus, the digital audio signal for a required time range 356 in the first memory 204 is copied to the audio signal memory 214.

When the amplitude $a_1$ of the digital audio signal in the first memory 204 exceeds the scale, the audio signal input from the first memory 204 is in a clipped state, and may no longer be restored. When the first memory 204 detects that the digital audio signal has exceeded the scale as described above (detection point 352), a signal indicating that the digital audio signal has exceeded the scale is transmitted to the audio signal generating unit 212. The audio signal generating unit 212 changes the memory from which to extract a digital audio signal from the first memory 204 to the second memory 210.

While it is assumed in this case that the first memory 204 detects that the digital audio signal has exceeded the scale, the present invention is not limited to such a case. The first AD converter 202 may detect the exceeding of the scale when the first AD converter 202 is provided with a scale exceeding detecting function, or the audio signal generating unit 212 may monitor the first AD converter 202 or the first memory 204 and detect the exceeding of the scale.

At this time, as described above, rather than extracting a digital audio signal for a period when the scale is exceeded after the detection point 352 from the second memory 210, the audio signal generating unit 212 traces back to a zero crossing point 354 in a stage preceding a cycle to which the period belongs (including the amplitude maximum time point), and then extracts a digital audio signal. As a result of such a process, in addition to the required time range 356 in the first memory 204, the digital audio signal for the required time range 358 in the second memory 210 is multiplied predetermined times, and then copied to the audio signal memory 214.

After the audio signal generating unit 212 generates a new digital audio signal, memory areas for the time ranges in the first memory 204 and the second memory 210 can be set free, that is, in a state allowing overwriting.

After the new digital audio signal is generated, contents in the first memory 204 and the second memory 210 are unnecessary. Because contents in both the memories can thus be overwritten any number of times, it is unnecessary to provide an excessive memory capacity for digital audio signals to the two memories.

The audio signal memory 214 stores the digital audio signal thus generated by the audio signal generating unit 212 as a final audio signal.

The digital recording device 100 reconstructs a new audio signal from temporarily stored audio signals. The digital recording device 100 can therefore respond to a sudden signal change while effectively using a dynamic range. As a result, sound quality can be maintained.

Figure 6:
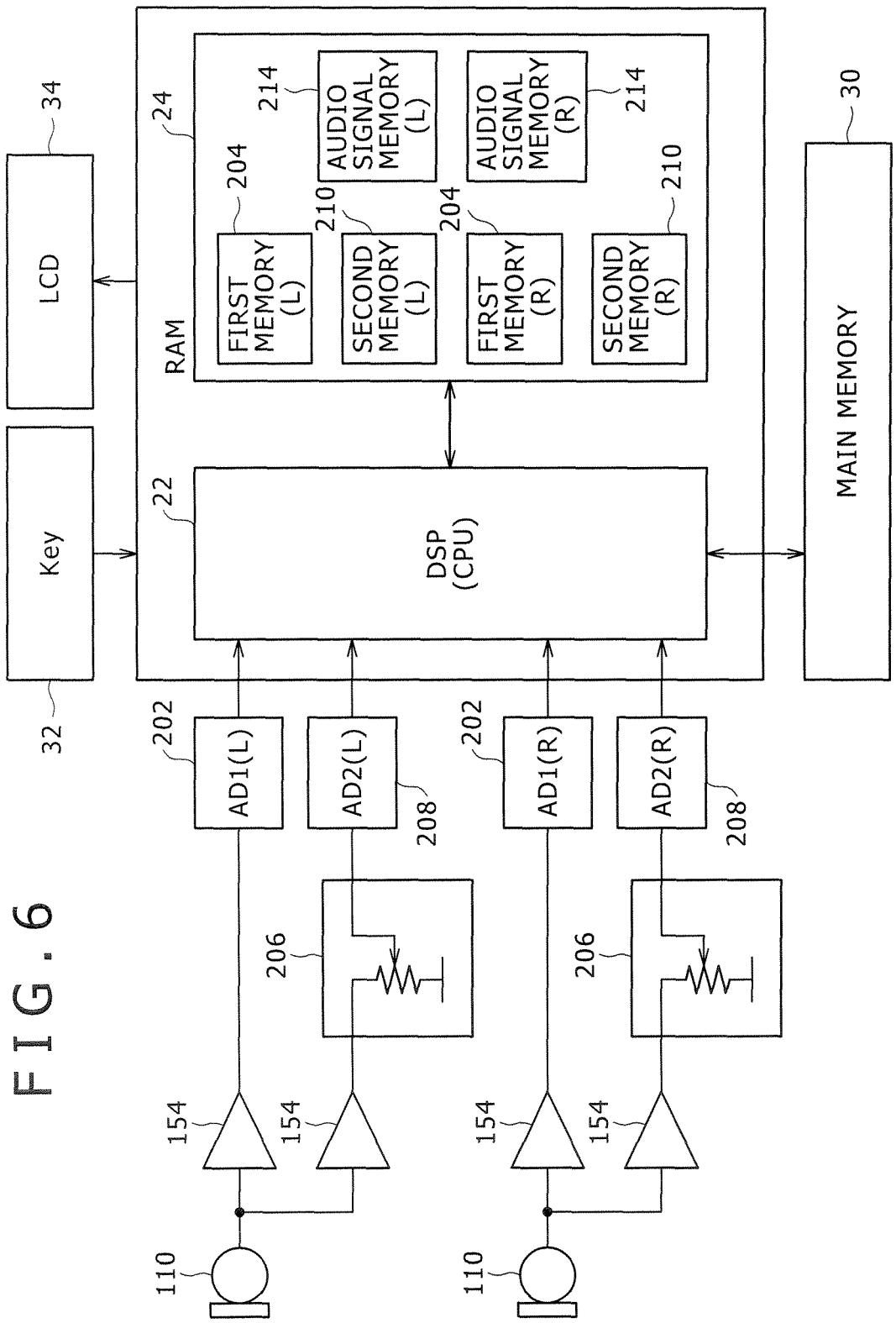
FIG. 6 is a block diagram schematically showing a circuit configuration of the digital recording device.

FIG. 6 is a block diagram schematically showing a circuit configuration of the above-described digital recording device 100. In this figure, on the basis of the concrete configuration of the above-described digital recording device 100, relation between two microphones 110 is shown. The components of the digital recording device 100 have substantially the same functions as the components already described above except that two paths, that is, a left path and a right path from the microphones 110 are provided, and therefore repeated description thereof will be omitted.

(Audio Signal Generating Unit 212)

Next, scales allocated for digital audio signals in the first memory 204 and the second memory 210 will be defined, and processing of the audio signal generating unit 212 based on the allocated scales will be described in detail.

Figure 7:
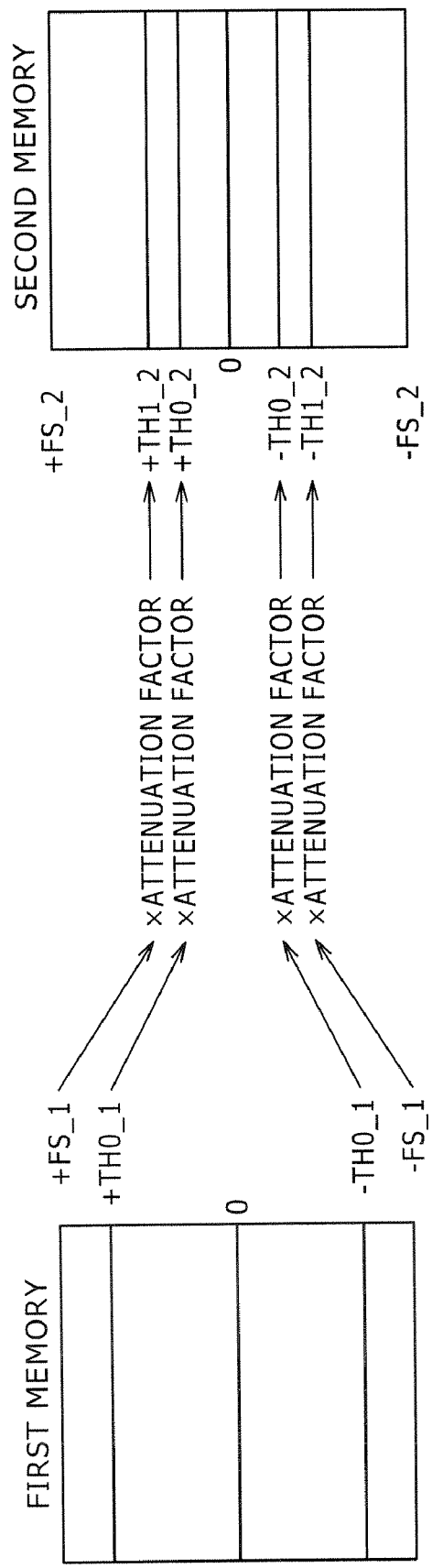
FIG. 7 is a diagram of assistance in explaining the allocation of scales for digital audio signals in a first memory and a second memory.

FIG. 7 is a diagram of assistance in explaining the allocation of scales for digital audio signals in the first memory 204 and the second memory 210. In this case, 32-bit digital audio signals, for example, in the first memory 204 and the second memory 210 are represented.

+FS_1 in the first memory 204 and +FS_2 in the second memory 210 denote plus side measurement ranges (Full Scale) of the respective AD converters 202 and 208. −FS_1 in the first memory 204 and −FS_2 in the second memory 210 denote minus side measurement ranges (Full Scale). The first memory 204 is provided with a predetermined threshold value (Threshold), for example a value obtained by multiplying the above FS_1 by 0.8. The threshold value may be a value obtained by multiplying FS_1 by a decimal less than one, and can be determined arbitrarily. The threshold value on the plus side is +TH0_1, and the threshold value on the minus side is −TH0_1.

The second memory 210 retains values obtained by multiplying the audio signal input to the first memory 204 by an attenuation factor. For example, +TH1_2 in the second memory 210 corresponding to +FS_1 in the first memory 204 is a value obtained by multiplying +FS_1 by the attenuation factor, and −TH1_2 corresponding to −FS_1 is a value obtained by multiplying −FS_1 by the attenuation factor.

Further, +TH0_2 corresponding to +TH0_1 in the first memory 204 is a value obtained by multiplying +TH0_1 by the attenuation factor, and −TH0_2 corresponding to −TH0_1 is a value obtained by multiplying −TH0_1 by the attenuation factor.

Description in the following will be made of the processing of the audio signal generating unit 212 on the basis of the allocated scales shown in FIG. 7. Cited in the following are roughly cases where the maximum amplitude value (absolute value) $a_1$ of a digital audio signal in the first memory 204 is $a_1 \leq TH0\_1$, $TH0\_1 < a_1 \leq FS\_1$, and $FS\_1 < a_1$.

FIG. 8 is a timing chart showing the processing of the audio signal generating unit 212 when the maximum amplitude value $a_1$ of a digital audio signal in the first memory 204 is $a_1 \leq TH0\_1$. When the maximum amplitude value $a_1$ of the audio signal is $a_1 \leq TH0\_1$, it is determined that the maximum amplitude value $A_1$ of the digital audio signal in the first memory 204 is within the measurement range 350 of the first AD converter 202, and the digital audio signal in the first memory 204 is transferred to the audio signal memory 214 as it is without the digital audio signal in the second memory 210 being referred to.

In FIG. 8 and similar timing charts to be described below, hatched digital audio signals are not used, and non-hatched areas are copied as a new digital audio signal.

FIG. 9 is a timing chart showing the processing of the audio signal generating unit 212 when the maximum amplitude value $a_1$ of a digital audio signal in the first memory 204 is in the range $TH0\_1 < a_1 \leq FS\_1$. When the maximum amplitude value $a_1$ of the audio signal is in the range $TH0\_1 < a_1 \leq FS\_1$, it is determined that the maximum amplitude value $A_2$ of the digital audio signal is within the measurement range 350 of the first AD converter 202, but exceeds the predetermined threshold value TH0_1. The audio signal generating unit 212 stops referring to the digital audio signal in the first memory 204, and extracts the digital audio signal in the second memory 210.

However, when the audio signal generating unit 212 extracts the digital audio signal from the second memory 210, the audio signal generating unit 212 multiplies the digital audio signal in the second memory 210 by (1/Attenuation Factor) and refers to the digital audio signal in the second memory 210. That is, during a period 400 when the maximum amplitude value $a_1$ of the digital audio signal $x_1$ in the first memory 204 is between TH0_1 and FS_1, the audio signal generating unit 212 multiplies the audio signal $x_2$ in the second memory 210 by (FS_1/TH1_2), and stores the result in the audio signal memory 214. In FIG. 9, for example, an amplitude $A_3$ is multiplied by (FS_1/TH1_2) to become $A_4$.

A point of reference switching between the first memory 204 and the second memory 210 is a first zero crossing point in a cycle where $TH0\_1 < a_1 \leq FS\_1$, as described above. The zero crossing point may be a point where the value of the digital audio signal changes from a negative value to a positive value or from a positive value to a negative value, or only one of the change points may be used.

By additionally providing an intermediate stage as described above, it is possible to insert a transitional period at a time of extraction switching between the first memory 204 and the second memory 210, and thus perform switching smoothly.

FIG. 10 is a timing chart showing the processing of the audio signal generating unit 212 when the maximum amplitude value $a_1$ of a digital audio signal in the first memory 204 is in the range FS_1<$a_1$. When the maximum amplitude value $a_1$ of the audio signal is in the range FS_1<$a_1$, it is determined that the maximum amplitude value $A_5$ of the digital audio signal is outside the measurement range 350 of the first AD converter 202. The audio signal generating unit 212 stops referring to the digital audio signal in the first memory 204, and extracts the digital audio signal in the second memory 210.

In this case, when the audio signal generating unit 212 refers to the second memory 210, the digital audio signal in the second memory 210 is multiplied by (Measurement Range of First AD Converter 202/Amplitude Maximum Value of Digital Audio Signal). The measurement range of the first AD converter 202 represents a maximum measurement range on one side of a positive measurement range and a negative measurement range. The amplitude maximum value of the digital audio signal represents a maximum absolute value of the digital audio signal. During a period 402 when the maximum amplitude value $a_1$ of the digital audio signal $x_1$ is higher than FS_1, the audio signal generating unit 212 multiplies the value $x_2$ in the second memory 210 during the period 402 by (FS_1/$A_6$), and stores the result in the audio signal memory 214.

A point of reference switching between the first memory 204 and the second memory 210 is a first zero crossing point in a cycle where FS_1<$a_1$, as described above.

Such a configuration makes it possible to listen to the digital audio signal attenuated by a predetermined attenuation factor using the maximum range of audible levels, and maintain sound quality without giving a sense of.

Suppose in the following that the maximum amplitude value $a_1$ of the audio signal is in the range FS_1<$a_1$, and that the maximum amplitude value of the wave of the continuous audio signal increases.

FIG. 11 is a timing chart showing the processing of the audio signal generating unit 212 when the maximum amplitude value $a_1$ of the digital audio signal is in the range FS_1<$a_1$, and the maximum amplitude value of the wave of the continuous audio signal increases. As described above, when the maximum amplitude value $a_1$ of the digital audio signal is in the range FS_1<$a_1$, it is determined that the maximum amplitude value of the digital audio signal is outside the measurement range 350 of the first AD converter 202. The audio signal generating unit 212 stops referring to the digital audio signal in the first memory 204, and extracts the digital audio signal in the second memory 210.

In a first cycle 410 where FS_1<$a_1$, the audio signal generating unit 212 multiplies the value in the second memory 210 in FIG. 11 by (FS_1/$A_8$), and stores the result in the audio signal memory 214. When the maximum amplitude value $a_1$ of a next wave of the continuous audio signal is in the range FS_1<$a_1$, whether the maximum amplitude value is higher than the wave in the immediately preceding cycle 410 is determined. When the maximum amplitude value is higher than the immediately preceding wave, the audio signal generating unit 212 multiplies the value in the second memory 210 in the cycle 412 in FIG. 11 by (FS_1/$A_{10}$), and stores the result in the audio signal memory 214. As long as the calculation in the second memory 210 is performed with a scale factor as described above, maximum amplitude values in the audio signal memory 214 for the period 410 and the period 412 are equal to each other.

In addition, the audio signal generating unit 212 refers to the second memory 210 in advance, and when the amplitude maximum value of the digital audio signal falls consecutively outside the measurement range of the first AD converter 202, the audio signal generating unit 212 compares the consecutive amplitude maximum values. When a next amplitude maximum value is lower than a previous amplitude maximum value, a gradually decreasing function f(n) that provides one at the previous amplitude maximum time point may be calculated, and the digital audio signal in the second memory 210 may be multiplied by (Measurement Range of First AD Converter 202/Amplitude Maximum Value of Digital Audio Signal×Gradually Decreasing Function) when extracted from the second memory 210. In this function, n is the number of samplings with zero as an initial value, and is incremented by one at each time of sampling the audio signal in the first AD converter 202.

FIG. 12 is a timing chart showing the processing of the audio signal generating unit 212 when the maximum amplitude value $a_1$ of the digital audio signal is in the range FS_1<$a_1$, and the maximum amplitude value of the wave of the continuous audio signal decreases. When the maximum amplitude value $a_1$ of the audio signal is in the range FS_1<$a_1$, it is determined that the amplitude maximum value of the digital audio signal is outside the measurement range 350 of the first AD converter 202. The audio signal generating unit 212 stops referring to the digital audio signal in the first memory 204, and extracts the digital audio signal in the second memory 210.

At this time, the audio signal generating unit 212 refers to the digital audio signal in the second memory 210 in advance. When a maximum amplitude value $A_{12}$ in a previous cycle 420 is also in the range FS_1<$a_1$ (TH1_2<$A_{12}$), the audio signal generating unit 212 multiplies the maximum amplitude value $A_{12}$ in the second memory 210 in the previous cycle 420 by a gradually decreasing function f(n), and then compares the result with a maximum amplitude value $A_{13}$ in a present cycle. When $A_{12}×f(n)>A_{13}$, the audio signal generating unit 212 multiplies the digital audio signal $x_2$ in the second memory 210 by (FS_1/$A_{13}$×f(n)), and stores the result in the audio signal memory 214.

When the above condition is not satisfied, the audio signal generating unit 212 simply multiplies the digital audio signal $x_2$ in the second memory 210 in the cycle 422 by (FS_1/$A_{13}$), and stores the result in the audio signal memory 214.

Figure 13:
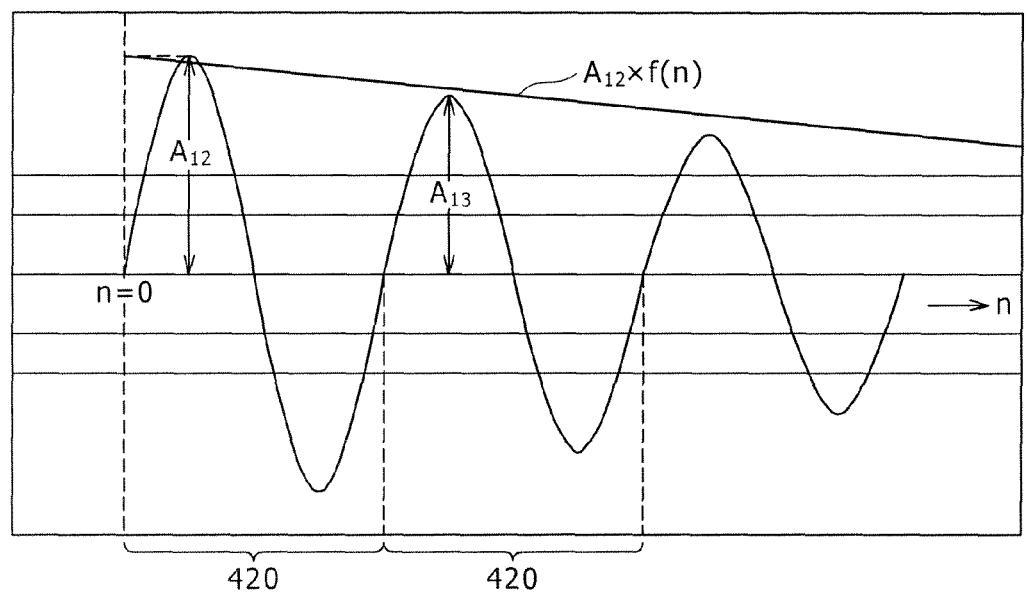
FIG. 13 is a diagram of assistance in explaining a gradually decreasing function in detail.

FIG. 13 is a diagram of assistance in explaining such a gradually decreasing function f(n) in detail. The gradually decreasing function f(n) has one as an initial value, is decreased each time the sampling number n is incremented, and eventually becomes zero. For example, the gradually decreasing function f(n) can be expressed as an equation $f(n)=1-a×n$, $1/b×n$ or the like, where a and b are set by a sampling interval and the slope of gradual decrease, and are represented by a low numerical value less than one (large time constant).

First, when the maximum amplitude value $a_1$ of the digital audio signal in the first memory 204 exceeds FS_1 in the cycle 420, the audio signal generating unit 212 determines whether a maximum amplitude value in a previous cycle is in the range FS_1<$a_1$, and whether Previous Maximum Amplitude Value×f(n)>$A_{12}$. In this case, the condition that Previous Maximum Amplitude Value×f(n)>$A_{12}$ is not satisfied. Therefore, the gradually decreasing function f(n) is reset, and the value $A_{12}$ is retained for later calculation. Then, a first zero crossing point in the cycle 420 is set as n=0 (f(n)=1), and the gradually decreasing function f(n) is started. As described above, the gradually decreasing function f(n) assumes a value of one when n=0, and is decreased each time the number of samplings is incremented. Hence, $A_{12} \times f(n)$ is also decreased, and a curve $A_{12} \times f(n)$ as shown in FIG. 13 is derived. This curve $A_{12} \times f(n)$ is continued until the curve becomes less than TH0_2, and thereafter TH0_2 is retained.

The gradually decreasing function f(n) is reset to one when an amplitude maximum value is higher than Previous Amplitude Maximum Value×Gradually Decreasing Function, as described above. A scale factor including the gradually decreasing function in the mathematical expression is applied to a region where the amplitude maximum value is decreasing, and is not applied to a region where the amplitude maximum value is increasing. When the amplitude maximum value increases, the gradually decreasing function is reset to one, so that the gradually decreasing function for a next region where the amplitude maximum value is decreasing can be started at one.

Next, when the maximum amplitude value $a_1$ of the digital audio signal in the first memory 204 exceeds FS_1 in a cycle 422, the audio signal generating unit 212 determines whether the maximum amplitude value $a_1$ in the previous cycle 420 is in the range FS_$1<a_1$. When the above condition is satisfied, the audio signal generating unit 212 next calculates $A_{12} \times f(n)$, and compares $A_{12} \times f(n)$ with $A_{13}$. When the condition that $A_{12} \times f(n) > A_{13}$ is satisfied, the gradually decreasing function f(n) is not reset, and n continues to be incremented. Then, in the cycle 422, the audio signal generating unit 212 stores a value obtained by multiplying the digital audio signal $x_2$ in the second memory 210 by (FS_$1/A_{12} \times f(n)$) in the audio signal memory 214.

Referring to FIG. 13, the first amplitude $A_{12}$ exceeds the curve $A_{12} \times f(n)$. However, no problem occurs because the first amplitude is not an object for comparison in the present embodiment.

The gradually decreasing function f(n) gradually decreases the scale factor for the digital audio signal in the second memory 210, so that a gradual return can be made to normal level (within the measurement range of the first AD converter 202).

In the present embodiment, the gradually decreasing function is multiplied to provide a sense of sound decrease only when the maximum amplitude value decreases. It is of course possible to multiply a gradually increasing function when the maximum amplitude increases. Considering that when such processing is performed in the case where the maximum amplitude gradually increases, a first maximum amplitude value needs to be restored with a very small amplitude, and therefore a sense of incongruity is produced for the decrease of the audio signal, the present embodiment does not multiply a gradually increasing function when the maximum amplitude increases.

In addition, though linearity of the original waveform of the audio signal may not be maintained because of such a gradually decreasing function, no problem occurs because the gradually decreasing function is intended for the audio signal of high sound volume essentially including an element of noise.

Figure 14:
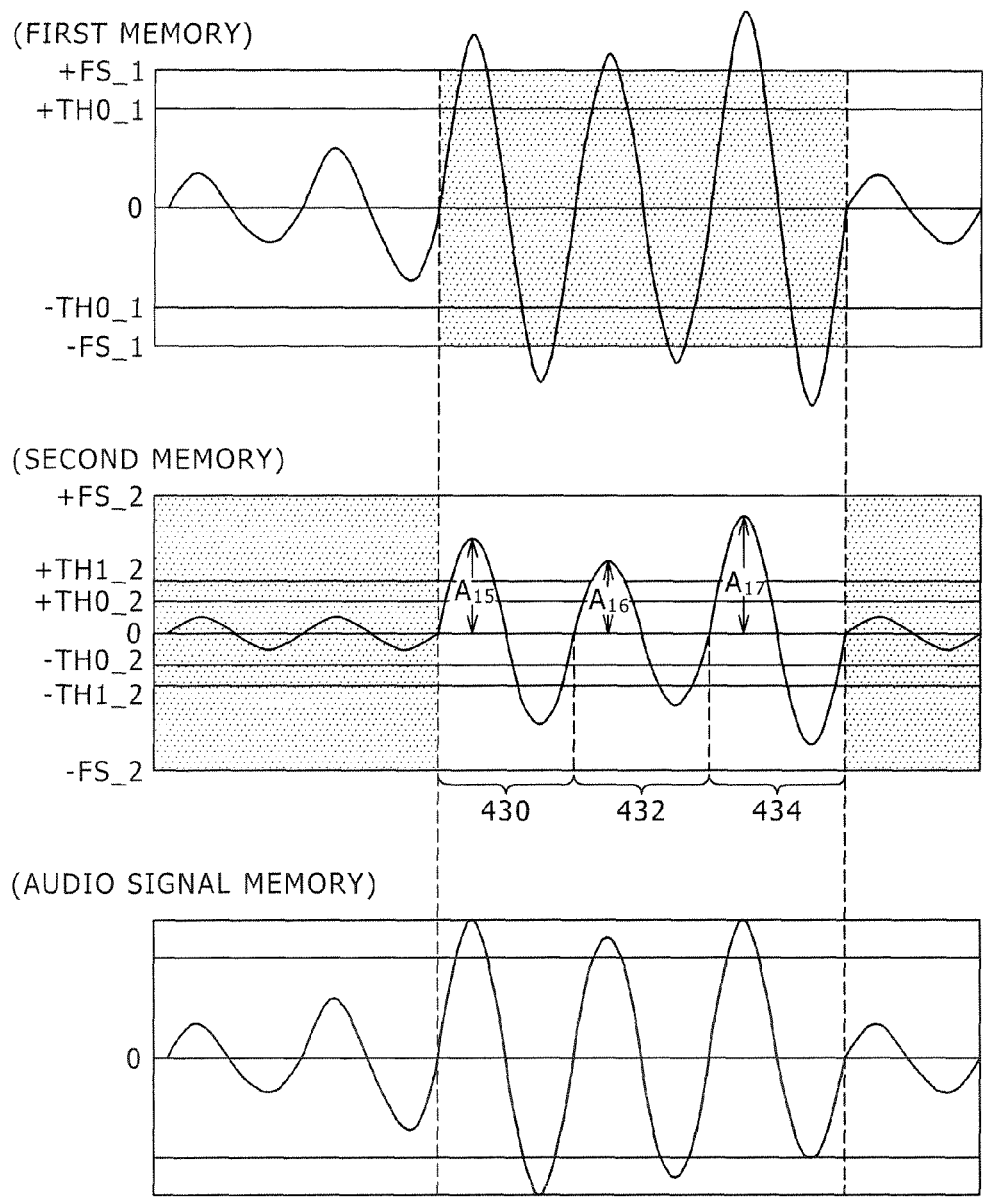
FIG. 14 is a timing chart showing processing of the audio signal generating unit.

FIG. 14 is a timing chart showing the processing of the audio signal generating unit 212 when the maximum amplitude value $a_1$ of the digital audio signal in the first memory 204 is in the range FS_$1<a_1$, and the maximum amplitude value of the wave of the continuous audio signal decreases or increases. When the maximum amplitude value $a_1$ of the audio signal is in the range FS_$1<a_1$, it is determined that the amplitude maximum value of the digital audio signal is outside the measurement range 350 of the first AD converter 202. The audio signal generating unit 212 stops referring to the digital audio signal in the first memory 204, and extracts the digital audio signal in the second memory 210.

At this time, the audio signal generating unit 212 multiplies the digital audio signal in the second memory 210 in a cycle 430 by (FS_$1/A_{15}$) and stores the result in the audio signal memory 214, multiplies the digital audio signal in the second memory 210 in a cycle 432 by (FS_$1/A_{16} \times f(n)$) and stores the result in the audio signal memory 214, and multiplies the digital audio signal in the second memory 210 in a cycle 434 by (FS_$1/A_{17}$) and stores the result in the audio signal memory 214.

Figure 15:
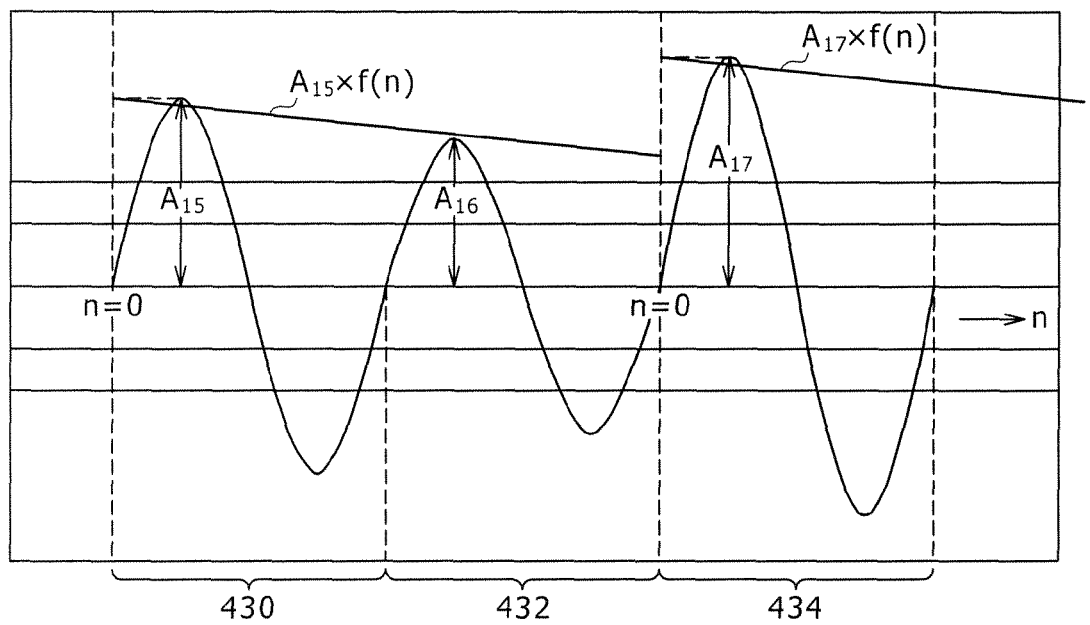
FIG. 15 is a diagram of assistance in explaining a gradually decreasing function in detail.

FIG. 15 is a diagram of assistance in explaining such a gradually decreasing function f(n) in detail.

First, the audio signal generating unit 212 resets the gradually decreasing function f(n) in the cycle 430. Thus, a curve $A_{15} \times f(n)$ as shown in FIG. 15 is derived. Details of the condition in the processing of the audio signal generating unit 212 has already been described with reference to FIG. 13, and therefore repeated description will be omitted.

Next, when the maximum amplitude value $a_1$ of the digital audio signal in the first memory 204 exceeds FS_1 in the cycle 432, a maximum amplitude value in the previous cycle 430 is in the range FS_$1<a_1$, and a condition that $A_{15} \times f(n) > A_{16}$ is satisfied, the audio signal generating unit 212 does not reset the gradually decreasing function f(n), and continues to increment n. Then, in the cycle 432, the audio signal generating unit 212 stores a value obtained by multiplying the digital audio signal in the second memory 210 by (FS_$1/A_{15} \times f(n)$) in the audio signal memory 214.

Next, in response to $A_{16} \times f(n) < A_{17}$ in the cycle 434, the audio signal generating unit 212 resets the gradually decreasing function f(n). Hence, a curve $A_{17} \times f(n)$ as shown in FIG. 15 is newly derived. The digital audio signal in the second memory 210 is multiplied by (FS_$1/A_{17}$), and the result is stored in the audio signal memory 214.

Thus, even when the amplitude maximum value is varied in the range FS_$1<a_1$, the audio signal generating unit 212 can perform appropriate recording by referring to the digital audio signal in the second memory 210 as executed to maintain sound quality.

While the audio signals shown in the above timing charts are sine waves in order to facilitate understanding, actual audio signals are not limited to such a case, and are represented by waveforms in which signals of various frequencies are mixed with each other. In addition, while the maximum amplitude values to be determined have been described using positive waveforms in order to facilitate understanding, the waveforms may of course be positive or negative, and the maximum amplitude values may be determined on the basis of the absolute values thereof.

Second Embodiment

Digital Recording Method

Description will next be made of detailed operation of a digital recording method for performing digital recording using a digital recording device 100 that can continuously store sound such as voice or the like.

Figure 16:
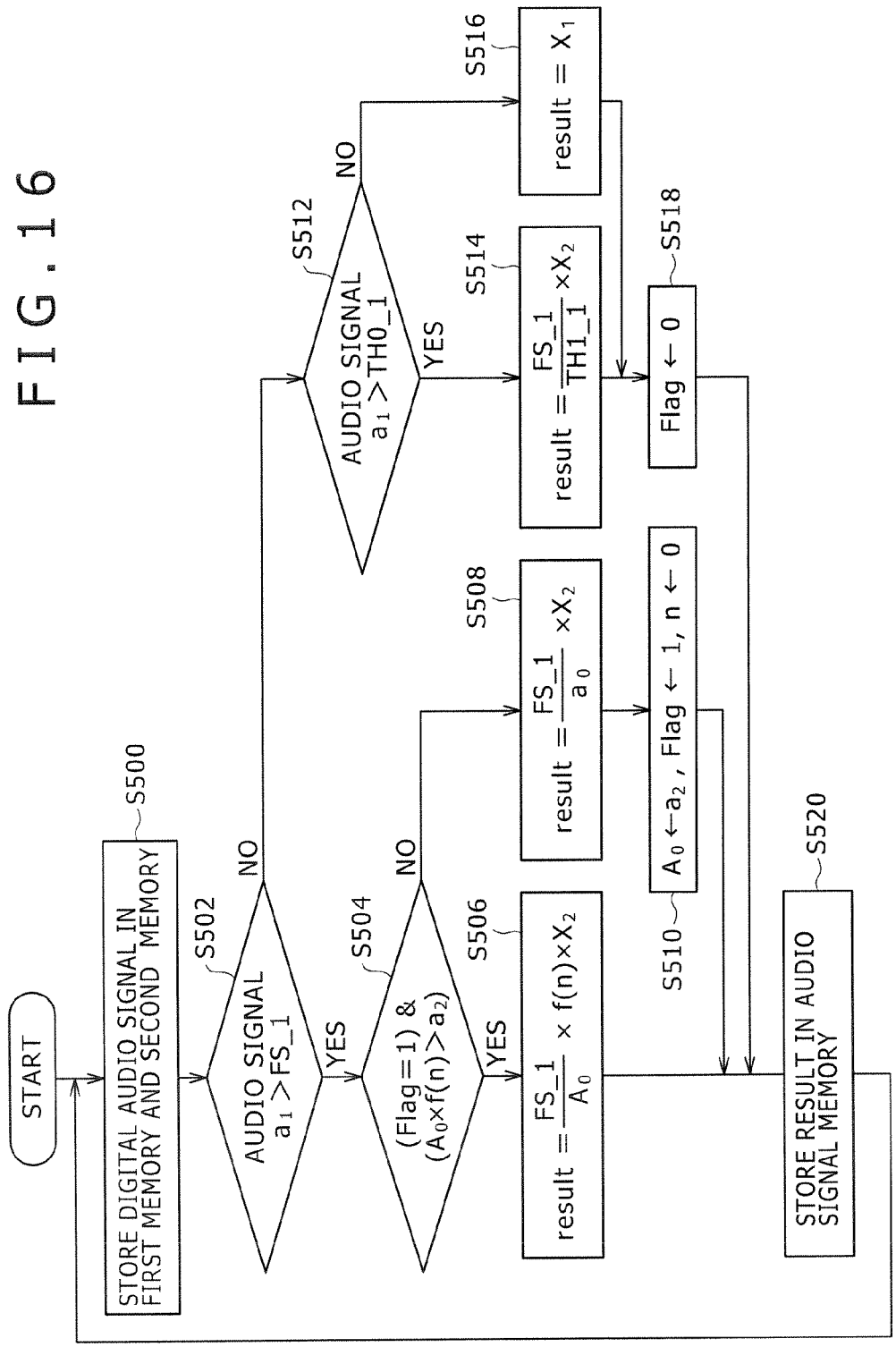
FIG. 16 is a flowchart showing a flow of a digital recording method according to a second embodiment.

FIG. 16 is a flowchart showing a flow of the digital recording method according to a second embodiment. The present embodiment uses input means of two systems, that is, a system in which an analog audio signal having a normal level is input and a system in which an analog audio signal having a sufficiently attenuated level is input, and combines digital audio signals from memories storing the audio signals independently of each other to generate a string of digital audio signals.

First, the digital recording device 100 resets Flag to be used in the following to zero. The digital recording device 100 thereafter converts an analog audio signal from a microphone 110 for converting collected sound into the analog audio signal into a digital audio signal, and stores the digital audio signal in a first memory 204. In parallel with this, the digital recording device 100 converts an analog audio signal obtained by attenuating the analog audio signal with a predetermined attenuation factor into a digital audio signal, and stores the digital audio signal in a second memory 210 (S500).

Next, a control unit 150 of the digital recording device 100 reads the maximum amplitude value $a_1$ of the audio signal stored in the first memory 204, and determines whether the maximum amplitude value $a_1$ of the audio signal is larger than the full scale FS_1 of a first AD converter 202 (S502).

When the maximum amplitude value $a_1$ of the audio signal is larger than the full scale FS_1, whether Flag indicating that amplitude is being gradually decreasing is one is determined, and $A_0 \times f(n)$ including a maximum amplitude value $A_0$ before a cycle including a maximum amplitude value $a_2$ in the second memory 210 and a gradually decreasing function $f(n)$ is compared with $a_2$ (S504). When Flag=1, and $A_0 \times f(n) > a_2$, it is determined that a wave including the value $a_2$ is gradually decreasing, and an audio signal generating unit 212 multiplies the digital audio signal $x_2$ for one cycle including $a_2$ in the second memory 210 by $(FS\_1/A_0 \times f(n))$ (S506).

When one of the conditions that Flag=1 and that $A_0 \times f(n) > a_2$ is not satisfied, the audio signal generating unit 212 multiplies the digital audio signal $x_2$ for one cycle including $a_2$ in the second memory 210 by $(FS\_1/a_2)$ (S508). At this time, in consideration of a case where the condition that $a_1 > FS\_1$ is newly satisfied, the maximum amplitude value $a_2$ in the second memory 210 is set as $A_0$, which serves as an initial value of the maximum amplitude value when the gradually decreasing function is applied to a subsequent wave, and Flag is set to one. Since the wave including the maximum amplitude value $a_2$ is at least not being decreasing, $f(n)$ is reset, that is, a first zero crossing point in the cycle is set as n=0 (S510).

When the maximum amplitude value $a_1$ of the audio signal is smaller than FS_1 (S502), the audio signal $a_1$ is compared with a predetermined threshold value TH0_1 (S512). When $a_1$ is larger than TH0_1, the audio signal generating unit 212 multiplies the digital audio signal $x_2$ for one cycle including $a_2$ in the second memory 210 by $(FS\_1/TH1\_1)$ (S514).

When the audio signal $a_1$ is smaller than the predetermined threshold value TH0_1 (S512), the audio signal generating unit 212 outputs the digital audio signal $x_1$ for one cycle including $a_1$ in the first memory 204 as it is as a result (S516). When operation processing (S514 or S516) is ended, Flag is reset to zero because at least the continuity of $a_1 > FS\_1$ is broken (S518).

The audio signal generating unit 212 stores the thus produced result as a new digital audio signal in an audio signal memory 214 (S520).

In addition, a program for making a computer perform the above-described digital recording method and a storage medium on which the program is stored are provided.

While preferred embodiments of the present invention have been described above with reference to the accompanying drawings, it is needless to say that the present invention is not limited to such examples. It is obvious that various changes or modifications within the scope described in claims will occur to those skilled in the art, and it is therefore naturally understood that they fall within the technical scope of the present invention.

For example, while in the above-described embodiments, two AD converters are used to widen the dynamic range, the present invention is not limited to such a case. Three or more AD converters can be provided to perform a same recording function as described above with respective different attenuation factors. In addition, attenuation factors between the AD converters can be made equal, for example, factors of one, $\frac{1}{10}$, and $\frac{1}{100}$.

It is to be noted that the steps in the digital recording method in the present specification do not necessarily need to be performed in time series in the order described in the flowchart, and may include processes performed in parallel or individually (for example parallel processing or processing based on an object).

It should be understood by those skilled in the art that various modifications, combinations, sub-combinations and alterations may occur depending on design requirements and other factors insofar as they are within the scope of the appended claims or the equivalents thereof.

What is claimed is:

1. A digital recording device comprising:
a microphone configured to convert collected sound into an analog audio signal;
a first analog to digital converter configured to convert the analog audio signal converted by said microphone into a digital audio signal;
a first memory configured to store the digital audio signal of said first analog to digital converter;
an attenuator configured to attenuate said analog audio signal with a predetermined attenuation factor;
a second analog to digital converter configured to convert the attenuated analog audio signal into a digital audio signal;
a second memory configured to store the digital audio signal of said second analog to digital converter;
an audio signal generating unit configured to extract the digital audio signal in one of said first memory and said second memory for a required time range according to an amplitude maximum value of said digital audio signal, and generate a new digital audio signal, the audio signal generating unit configured to determine a first zero crossing point before and a second zero crossing point after each amplitude maximum value in the digital audio signal in the first memory that exceeds a threshold, and the audio signal generating unit generating the new digital audio signal by replacing the digital audio signal from the first memory with the digital audio signal from the second memory between the first zero crossing point and the second zero crossing point for each amplitude maximum value in the digital audio signal in the first memory that exceeds the threshold; and
an audio signal memory configured to store the new digital audio signal.

2. The digital recording device as claimed in claim 1, wherein said first analog to digital converter has a predetermined measurement range; and said audio signal generating unit extracts a digital audio signal from said first memory when the amplitude maximum value of the digital audio signal is within the measurement range of said first analog to digital converter, and said audio signal generating unit extracts a digital audio signal from said second memory, and generates a new digital audio signal when the amplitude maximum value of the digital audio signal is outside the measurement range of said first analog to digital converter.

3. A digital recording device comprising:
a microphone configured to convert collected sound into an analog audio signal;
a first analog to digital converter configured to convert the analog audio signal converted by said microphone into a digital audio signal;
a first memory configured to store the digital audio signal of said first analog to digital converter;
an attenuator configured to attenuate said analog audio signal with a predetermined attenuation factor;
a second analog to digital converter configured to convert the attenuated analog audio signal into a digital audio signal;
a second memory configured to store the digital audio signal of said second analog to digital converter;
an audio signal generating unit configured to extract the digital audio signal in one of said first memory and said second memory for a required time range according to an amplitude maximum value of said digital audio signal, and generate a new digital audio signal; and
an audio signal memory configured to store the generated digital audio signal,
wherein said first analog to digital converter has a predetermined measurement range; and said audio signal generating unit extracts a digital audio signal from said first memory when the amplitude maximum value of the digital audio signal is within the measurement range of said first analog to digital converter, and said audio signal generating unit extracts a digital audio signal from said second memory, and generates a new digital audio signal when the amplitude maximum value of the digital audio signal is outside the measurement range of said first analog to digital converter, and when extracted from said second memory, the digital audio signal in said second memory is multiplied by (Measurement Range of First Analog to Digital Converter/Amplitude Maximum Value of Digital Audio Signal).

4. The digital recording device as claimed in claim 3, wherein when the amplitude maximum value of the digital audio signal is within the measurement range of said first analog to digital converter but is outside a predetermined threshold range, said audio signal generating unit extracts the digital audio signal from said second memory, and said audio signal generating unit multiplies the digital audio signal in said second memory by (1/Attenuation Factor) when extracting the digital audio signal from said second memory.

5. The digital recording device as claimed in claim 4, wherein when a next amplitude maximum value is lower than said amplitude maximum value, a current value of a gradually decreasing function is calculated, the gradually decreasing function having an initial value of one at a previous amplitude maximum time point; and the digital audio signal in said second memory is multiplied by (Measurement Range of First Analog to Digital Converter/Amplitude Maximum Value of Digital Audio Signal×the Current Value of the Gradually Decreasing Function) when extracted from said second memory.

6. The digital recording device as claimed in claim 5, wherein said current value of the gradually decreasing function is reset to one when the amplitude maximum value is higher than Previous Amplitude Maximum Value×the Current Value of the Gradually Decreasing Function.

7. The digital recording device as claimed in claim 1, wherein said attenuation factor is 1/100.

8. The digital recording device as claimed in claim 1, wherein after said new digital audio signal is generated, memory areas for the predetermined time range in said first memory and said second memory are set in a state allowing overwriting.

9. A digital recording method comprising: converting an analog audio signal from a microphone, said microphone converting collected sound from said analog audio signal, into a digital audio signal;
storing the converted digital audio signal in a first memory;
converting an analog audio signal obtained by attenuating said analog audio signal with a predetermined attenuation factor into an attenuated digital audio signal in parallel with said storing;
storing the attenuated digital audio signal in a second memory; and
determining a first zero crossing point before and a second zero crossing point after each amplitude maximum value in the digital audio signal in the first memory that exceeds a threshold;
generating a new digital audio signal by replacing the digital audio signal from the first memory with the digital audio signal from the second memory between the first zero crossing point and the second zero crossing point for each amplitude maximum value in the digital audio signal in the first memory that exceeds the threshold; and
storing the new digital audio signal in an audio signal memory.

10. The digital recording method as claimed in claim 9, wherein said converting an analog audio signal from a microphone has a predetermined measurement range; and said generating extracts a digital audio signal from said first memory when the amplitude maximum value of the digital audio signal is within the measurement range of said converting an analog audio signal from a microphone, and said generating extracts a digital audio signal from said second memory, and generates a new digital audio signal when the amplitude maximum value of the digital audio signal is outside the measurement range of said converting an analog audio signal from a microphone.

11. A digital recording method comprising: converting an analog audio signal from a microphone, said microphone converting collected sound from said analog audio signal, into a digital audio signal; storing the converted digital audio signal in a first memory;
converting an analog audio signal obtained by attenuating said analog audio signal with a predetermined attenuation factor into an attenuated digital audio signal in parallel with said storing;
storing the attenuated digital audio signal in a second memory; and
extracting the digital audio signal in one of said first memory and said second memory for a required time range according to an amplitude maximum value of said digital audio signal, generating a new digital audio signal, and storing the new digital audio signal in an audio signal memory,
wherein said converting an analog audio signal from a microphone has a predetermined measurement range; and said generating extracts a digital audio signal from said first memory when the amplitude maximum value of the digital audio signal is within the measurement range of said converting an analog audio signal from a microphone, and said generating extracts a digital audio signal from said second memory, and generates a new digital audio signal when the amplitude maximum value of the digital audio signal is outside the measurement range of said converting an analog audio signal from a microphone, and when extracted from said second memory, the digital audio signal in said second memory is multiplied by (Measurement Range of First Analog to Digital Converter/Amplitude Maximum Value of Digital Audio Signal).

12. The digital recording method as claimed in claim 11, wherein when the amplitude maximum value of the digital audio signal is within the measurement range of said converting an analog audio signal from a microphone but is outside a predetermined threshold range, said generating extracts the digital audio signal from said second memory, and said generating multiplies the digital audio signal in said second memory by (1/Attenuation Factor) when extracting the digital audio signal from said second memory.

13. The digital recording method as claimed in claim 11, wherein when a next amplitude maximum value is lower than said amplitude maximum value, a current value of a gradually decreasing function is calculated, the gradually decreasing function having an initial value of one at a previous amplitude maximum time point; and the digital audio signal in said second memory is multiplied by (Measurement Range of First Analog to Digital Converter/Amplitude Maximum Value of Digital Audio Signal×the Current Value of the Gradually Decreasing Function) when extracted from said second memory.

14. The digital recording method as claimed in claim 13, wherein said current value of the gradually decreasing function is reset to one when the amplitude maximum value is higher than Previous Amplitude Maximum Value×the Current Value of the Gradually Decreasing Function.

15. The digital recording method as claimed in claim 9, wherein said attenuation factor is $1/100$.

16. The digital recording method as claimed in claim 9, wherein after said new digital audio signal is generated, memory areas for the predetermined time range in said first memory and said second memory are set in a state allowing overwriting.

17. A non-transitory computer readable storage medium on which a program is stored, said program making a computer perform a method comprising:
    converting an analog audio signal from a microphone, said microphone converting collected sound into said analog audio signal, into a digital audio signal, and storing the converted digital audio signal in a first memory;
    converting an analog audio signal obtained by attenuating said analog audio signal with a predetermined attenuation factor into a digital audio signal in parallel with the storing of the digital audio signal in said first memory, and storing the digital audio signal in a second memory;
    determining a first zero crossing point before and a second zero crossing point after each amplitude maximum value in the digital audio signal in the first memory that exceeds a threshold;
    generating a new digital audio signal by replacing the digital audio signal from the first memory with the digital audio signal from the second memory between the first zero crossing point and the second zero crossing point for each amplitude maximum value in the digital audio signal in the first memory that exceeds the threshold; and
    storing the new digital audio signal in an audio signal memory.

* * * * *